United States Patent [19]
Hanawa et al.

[11] Patent Number: 6,083,344
[45] Date of Patent: Jul. 4, 2000

[54] MULTI-ZONE RF INDUCTIVELY COUPLED SOURCE CONFIGURATION

[75] Inventors: Hiroji Hanawa, Sunnyvale; Tetsuya Ishikawa, Santa Clara; Manus Wong; Shijian Li, both of San Jose; Kaveh Niazi, Santa Clara; Kenneth Smyth, Sunnyvale; Fred C. Redeker, Fremont; Troy Detrick, Los Altos; Jay Dee Pinson, II, San Jose, all of Calif.

[73] Assignee: Applied Materials, Inc., Santa Clara, Calif.

[21] Appl. No.: 08/865,432

[22] Filed: May 29, 1997

[51] Int. Cl.[7] ..................................................... H05H 1/00
[52] U.S. Cl. ......................................... 156/345; 118/823 I
[58] Field of Search .......................... 156/345; 118/723 I, 118/723 IR, 728

[56] References Cited

U.S. PATENT DOCUMENTS

| | | |
|---|---|---|
| 5,401,350 | 3/1995 | Patrick et al. ............................ 156/345 |
| 5,767,628 | 6/1998 | Keller et al. ............................ 118/723 I |
| 5,792,272 | 8/1998 | Van Os et al. .......................... 118/723 I |
| 5,820,723 | 10/1998 | Benjamin et al. ....................... 158/345 |

FOREIGN PATENT DOCUMENTS

| | | |
|---|---|---|
| 0697467A1 | 2/1996 | European Pat. Off. . |
| 07 161695 | 6/1995 | Japan . |
| WO 9703224A | 1/1997 | WIPO . |

*Primary Examiner*—Thi Dang
*Attorney, Agent, or Firm*—Thomason, Moser & Patterson

[57] ABSTRACT

The present invention provides an HDP-CVD tool using simultaneous deposition and sputtering of doped and undoped silicon dioxide capable of excellent gap fill and blanket film deposition on wafers. The tool of the present invention includes: a dual RF zone inductively coupled plasma source; a dual zone gas distribution system; temperature controlled surfaces within the tool; a symmetrically shaped turbomolecular pumped chamber body; a dual cooling zone electrostatic chuck; an all ceramic/aluminum alloy chamber; and a remote plasma chamber cleaning system.

18 Claims, 16 Drawing Sheets

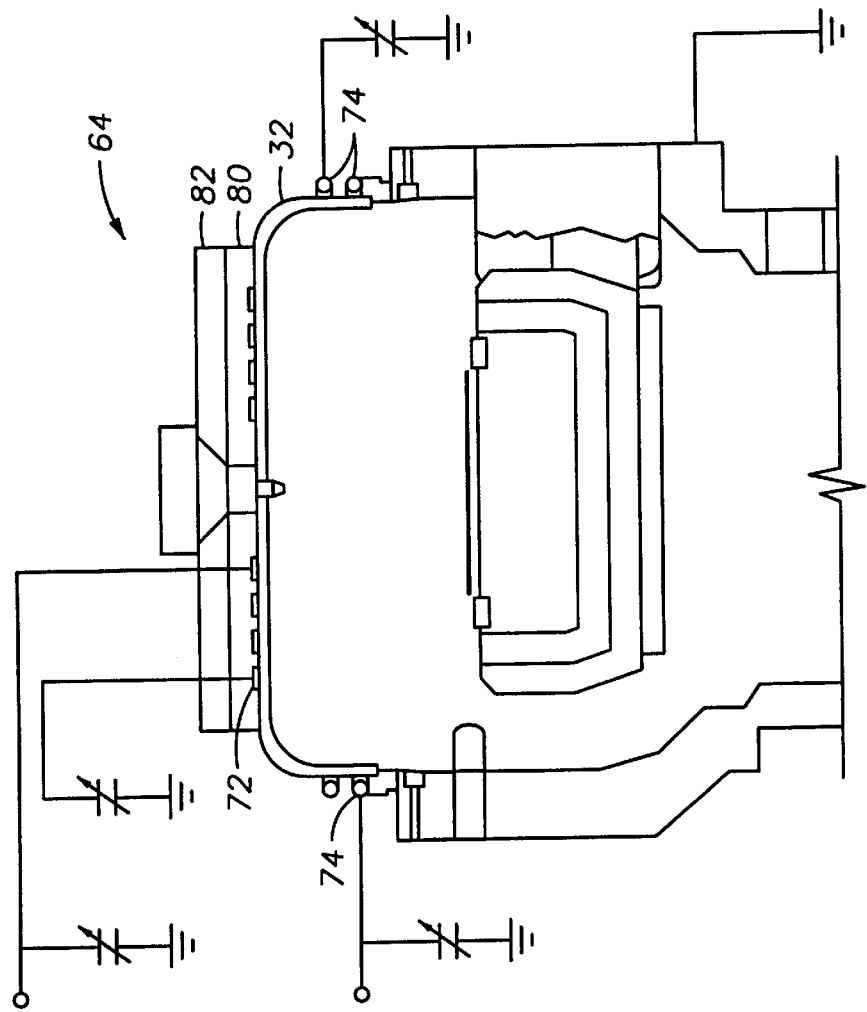
FIG. 3
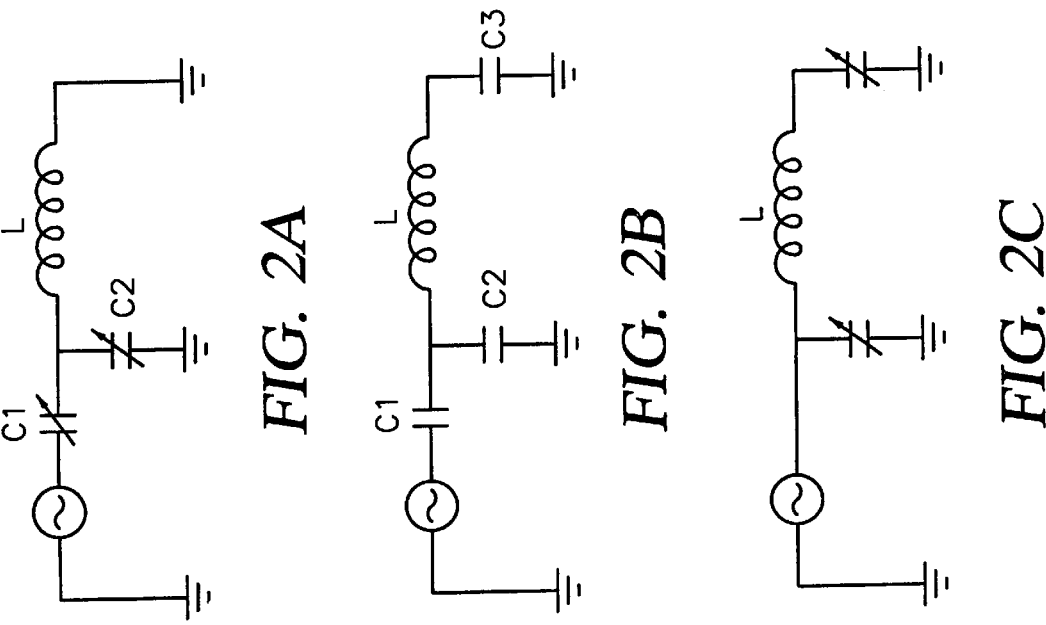
FIG. 2A
FIG. 2B
FIG. 2C

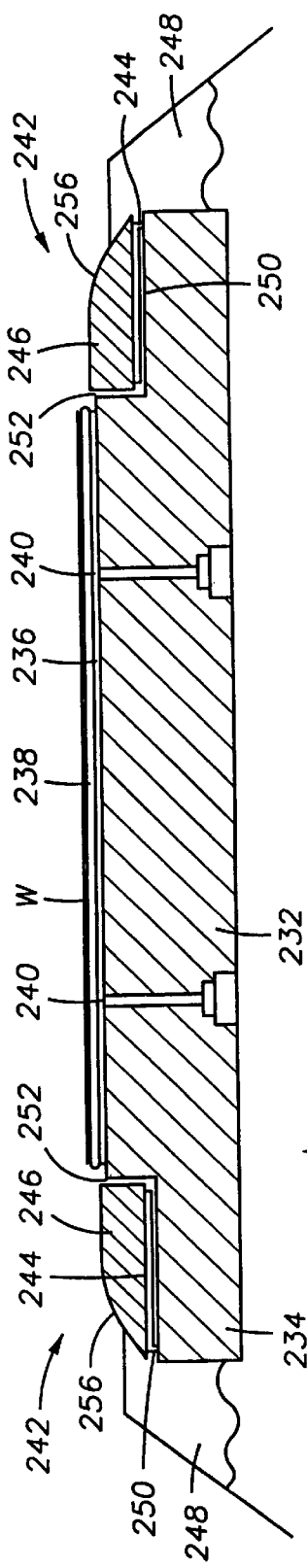
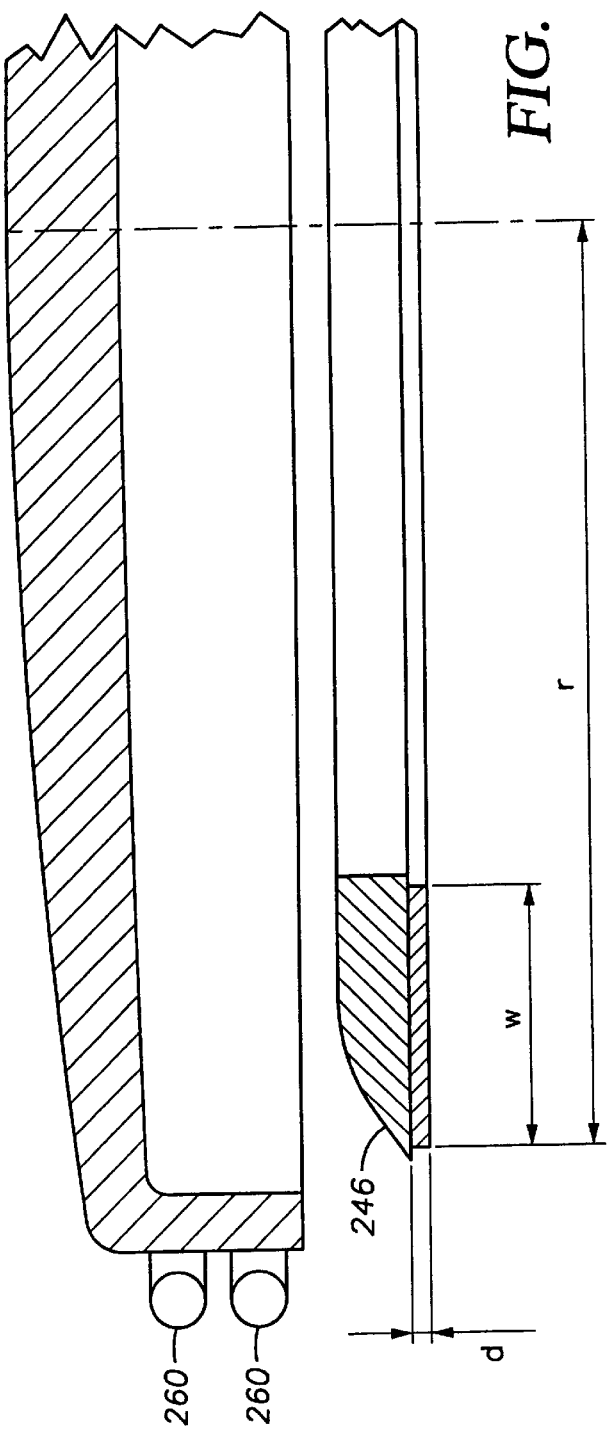
FIG. 11
FIG. 12

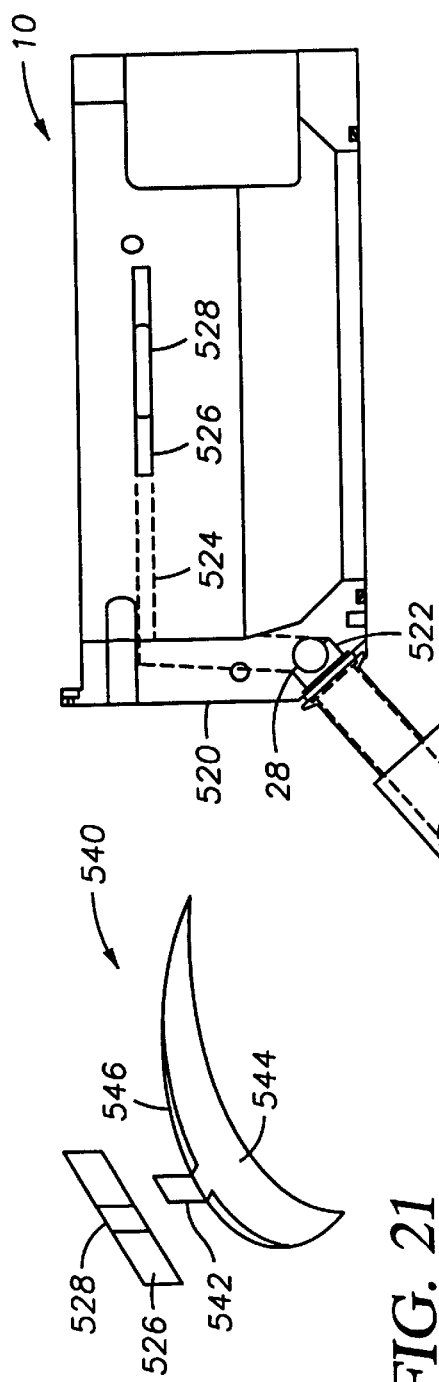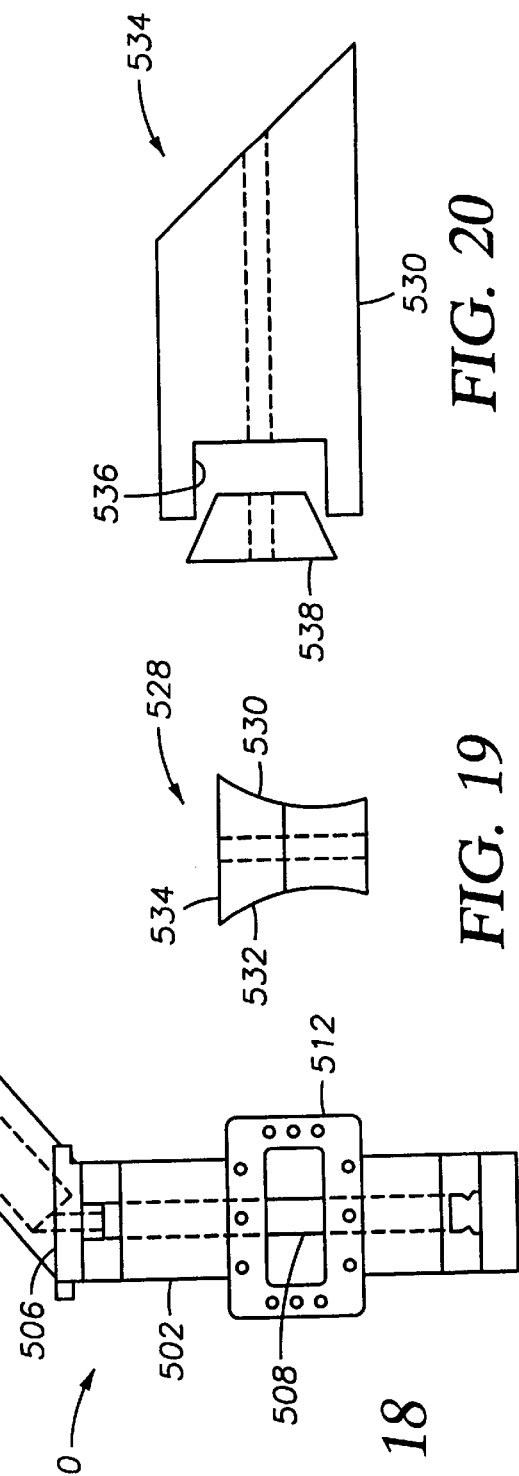

MULTI-ZONE RF INDUCTIVELY COUPLED SOURCE CONFIGURATION

FIELD OF THE INVENTION

The present invention relates to an apparatus and method for processing semiconductor substrates, and more particularly, to a high density plasma (HDP) chemical vapor deposition (CVD) tool for deposition of films, preferably αC, αFC, SiN, SiON, doped and undoped $SiO_2$ and BiN, onto substrates.

BACKGROUND OF THE INVENTION

Plasma tools used for semiconductor processes such as chemical vapor deposition (CVD), etching, reactive ion etching and so forth typically employ either inductive coupling or capacitive coupling to strike and maintain a plasma. One advantage of inductively coupled plasmas over capacitively coupled plasmas is that the inductively coupled plasma is generated with a much smaller bias voltage on the substrate, reducing the likelihood of damage thereto. In addition, inductively coupled plasmas have a higher ion density thereby providing higher deposition rates and mean free paths, while operating at a much lower pressure than capacitively coupled plasmas. These advantages allow in situ sputtering and/or ion directionality during processing.

More recently, high density plasma (HDP) CVD processes have been used to provide a combination of chemical reactions and physical sputtering. HDP-CVD processes promote the disassociation of the reactant gases by the application of radio frequency (RF) energy to the reaction zone proximate the substrate surface thereby creating a plasma of highly reactive ionic species. The relatively non-reactive ionic constituents, i.e., Ar, are given high momentum (e field) used to dislodge deposited film material selectively from specific areas along the profile of the film based on a sputter yield curve. The high reactivity of the released ionic species reduces the energy required for a chemical reaction to take place, thus lowering the required temperature for these processes.

The goal in most HDP-CVD processes is to deposit a film of uniform thickness across the surface of a substrate, while also providing good gap fill between lines and other features S formed on the substrate. Deposition uniformity and gap via fill are very sensitive to source configuration, gas flow changes, source radio frequency generator power, bias radio frequency generator power, gas nozzle design, including symmetry in distribution of nozzles, the number of nozzles, the height the nozzles are disposed above the substrate support and the lateral position of the nozzles relative to the substrate support. These variables change as processes performed within the tool change and as process gases change.

One problem encountered in semiconductor fabrication is generation and maintenance of plasma density uniformity above the substrate. Plasma uniformity is dependent upon magnetic and electric fields generated in the tool as well as gas flow into and out of the tool. As substrate sizes increase, i.e., to 300 mm, uniformity over a larger area becomes even more difficult achieve.

Another problem which affects deposition uniformity is uneven gas distribution over the substrate surface. Typically, a gas plenum is provided around the perimeter of a processing region and a plurality of nozzles extend radially inwardly to provide gases to the substrate surface. In some applications, the gases tend to be unevenly distributed across the substrate surface, with more gas provided towards the edge of the substrate and less gas provided towards the center of the substrate. In addition, reactant gases are typically mixed in the gas injection system prior to their introduction into the chamber. In these instances, material tends to deposit within the gas injection system itself, thereby clogging some gas injectors further heightening non-uniform gas distribution.

Still another problem encountered is maintaining a uniform temperature across the substrate surface. As a substrate is processed, there exists a significant heat load due to plasma radiation and ion bombardment exposed to the substrate surface. If a temperature gradient exists across the substrate surface, the deposition of the film can proceed in a non-uniform manner. Therefore, it is important to precisely control the temperature of the substrate.

Another problem is deposition of material on the tool itself. During processing, deposition material deposits throughout the tool, on the substrate support member, and on the gas distribution components. Over time, such material build up can flake off into the chamber resulting in particle contamination on the substrate which can compromise the integrity of the devices being fabricated. Thus, the tool must be periodically cleaned. A favored method of cleaning is to introduce cleaning gases into the chamber to react with the deposited material to form a product which can be exhausted from the chamber. Typically, a cleaning gas, such as a fluorinated gas, is introduced into the chamber and a plasma is struck in the chamber. The resultant excited products react with the deposition material to form gas phase byproducts which are then exhausted from the chamber. One problem with this process is that cleaning is typically localized in regions adjacent to the plasma. In order to enhance cleaning of all exposed chamber surfaces, the time period in which the cleaning process is performed is increased, thereby decreasing throughput, and/or the cleaning process is performed using high temperatures, thereby effectively over cleaning some of the chamber surfaces and increasing the cost of consumables and/or maintenance intervals.

Therefore, there is a need for a process tool which provides more uniform conditions for forming thin CVD films on a substrate, including enhanced cleaning features and high throughput, in a more manufacturing worthy way.

SUMMARY OF THE INVENTION

An embodiment of the present invention provides an HDP-CVD tool using deposition and sputtering of doped and undoped silicon dioxide capable of excellent gap fill and blanket film deposition on wafers having sub 0.5 micron feature sizes having aspect ratios higher than 1.2:1. The tool of the present invention includes: a dual RF zone inductively coupled plasma source; a dual zone gas distribution system; temperature controlled chamber components; a symmetrically shaped, turbomolecular pumped chamber body; a dual, cooling zone electrostatic chuck; an all ceramic/aluminum alloy chamber construction; and a remote plasma chamber cleaning system.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are, therefore, not to be considered limiting of its scope, for the invention may admit to other equally effective embodiments.

FIG. 2A–2C are electrical schematic views showing three various RF matching configurations which can be used to advance in the present invention;

FIG. 3 is a schematic cross sectional view showing the dual zone RF plasma source of the present invention;

FIG. 11 is a cross-sectional view of an electrostatic chuck and a cover ring;

FIG. 12 is a cross-sectional view of a cover ring disposed in proximity to a source coil;

FIG. 18 is a schematic side view partially in section showing the microwave remote plasma clean and its location on the chamber;

FIG. 19 is a top view of a gas diffuser;

FIG. 20 is a side view of a gas diffuser, and

FIG. 21 is a perspective view of a gas baffler.

DESCRIPTION OF A PREFERRED EMBODIMENT

The tool will be described in detail below with reference to each of the following subassemblies: a chamber body, a chamber lid assembly, a cathode and lift assembly, a process kit, a gas distribution assembly and a remote plasma source.

Chamber Body

Figure 1:
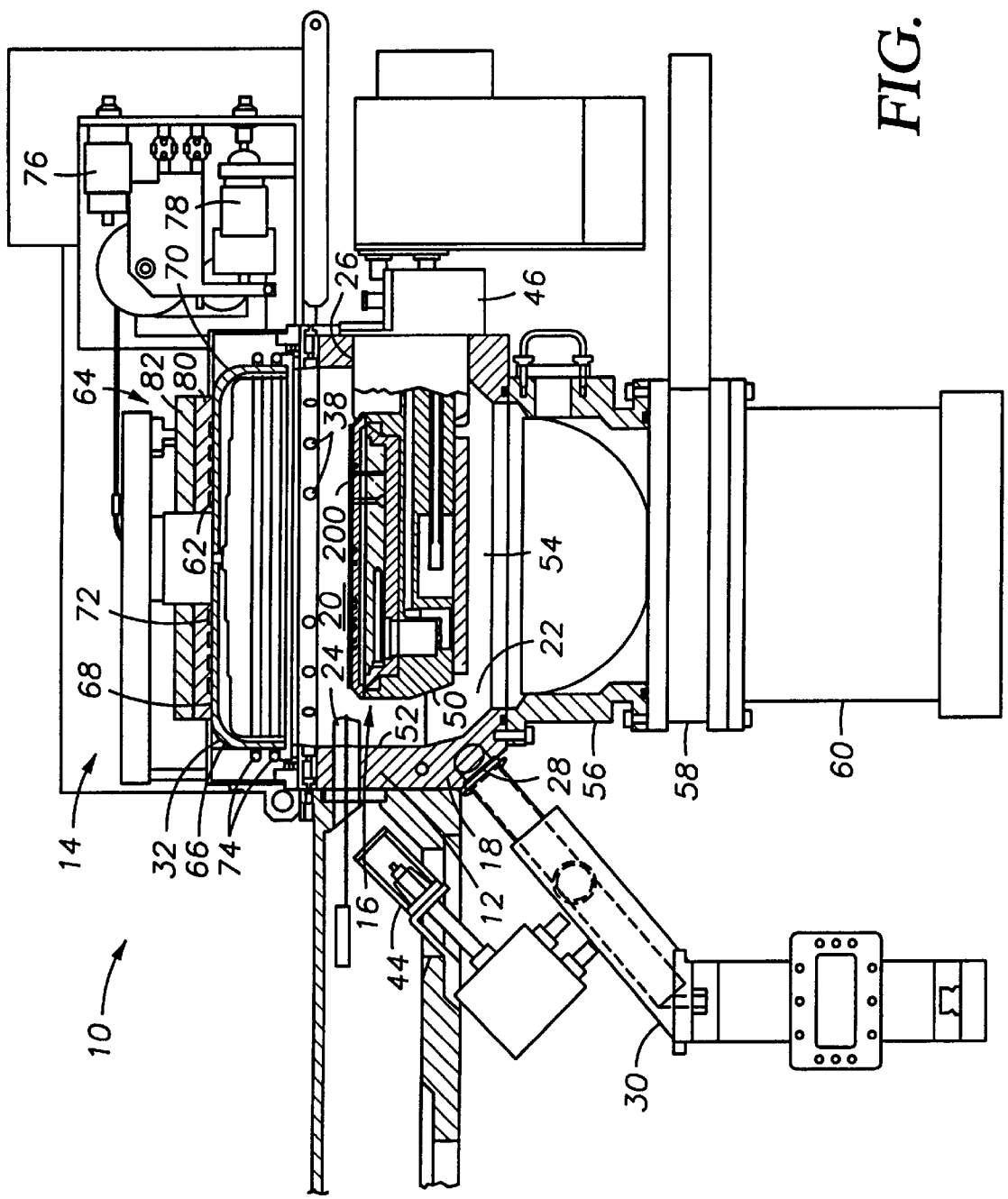
FIG. 1 is a cross sectional view of a process chamber of the present invention.

FIG. 1 is a cross sectional view of a processing tool 10 of the present invention. The processing tool 10 generally includes a chamber body 12, a lid assembly 14 and a cantilevered, removable substrate support member 16. These members in combination form a physically and electrically symmetric, evacuable enclosure and exhaust passage 22 in which substrate processing is carried out.

The chamber body 12 is preferably a unitary, machined structure having a sidewall 18 which defines an inner annular processing region 20 and tapers towards its lower end to define a concentric exhaust passage 22. The chamber body 12 defines a plurality of ports including at least a substrate entry port 24 sealed by a slit valve 44 and a side port 26 through which the cantilever mounted substrate support member 16 is disposed. The substrate entry port 24 and the support member port 26 are preferably disposed through opposite sides of the chamber body 12. Two additional side ports are disposed on opposite sides of the chamber wall 18 at about the level of the upper surface of the substrate support member 16 and are connected to a gas channel 28 formed in the chamber wall 18. Cleaning gases, such as disassociated fluorine containing gases, are introduced into the channel 28 from a remote plasma source 30 and into the chamber through the gas inlet ports provided therefor and shown in FIG. 18. The location of the openings of the ports into the chamber are provided to direct gases towards areas of the reactor where heavy build-up occurs. The remote plasma source and cleaning gas delivery will be described in more detail below.

The upper surface of the chamber wall 18 defines a generally flat landing area on which a base plate 33 of the lid assembly 34 is supported. One or more o-ring grooves 36 are formed in the upper surface of the wall 18 to receive one or more o-rings 38 to form an airtight seal between the chamber body 12 and the base plate 33. The lid assembly will be described in more detail below.

The substrate support member 16 partially extends through the side access port 26 formed in the chamber wall 18 and is mounted to the chamber wall 18 on a flange 46 to provide a generally annular substrate receiving surface 200 in the center of the chamber. When the support member 16 is positioned in the chamber, an outer wall 50 of the annular support member 16 and an inner wall 52 of the chamber define an annular fluid passage 22 that is substantially uniform about the entire circumference of the support member 16. It is preferred that the substantially uniform passage 22 and the exhaust port 54 be substantially concentric with the substrate receiving surface of the support member. The exhaust port 54 is centered below the substrate receiving portion of the support member 16 to draw the gases evenly through the uniform passage 22 and out of the chamber. This enables more uniform gas flow over the substrate surface about the entire circumference thereof and radially downwardly and outwardly from the chamber through exhaust port 54 centered in the base of the chamber. The uniform fluid passage 22 promotes uniform deposition of film layers by maintaining pressure and residence time uniformity, lacking in existing processing chambers, such as substrate locations with differing proximity in relation to the pumping port.

A pumping stack comprising a twin blade throttle assembly 56, a gate valve 58 and a turbomolecular pump 60 is mounted on the tapered lower portion of the chamber body to provide pressure control within the chamber. The twin blade throttle assembly 56 and the gate valve 58 are mounted between the chamber body 12 and the turbomolecular pump 60 to allow isolation via gate valve 58 and/or pressure control at pressures of from about 0 to about 100 milliTorr as determined by settings of the twin blade throttle assembly 56. A 1600 L/sec turbo pump is a preferred pump, however, any pump which can achieve the desired pressure in the chamber can be used. A foreline 57 is connected to the exhaust port 54 at positions upstream and downstream from the turbo pump. This provides backing pump capability. The foreline is connected to the remote mainframe pump, typically a roughing pump. A port 59 is formed in the pumping stack to mount a flange 61 of the foreline. During chamber cleaning, cleaning gases are flown into the chamber at a high rate, thereby increasing the pressure in the chamber. In one aspect of the invention, therefore, the turbo pump is isolated from the chamber by the gate valve 58 and the mainframe pump is used to maintain the pressure in the chamber during the cleaning process.

During processing of a substrate in the chamber, the vacuum pump evacuates the chamber to a pressure in the range of about 4 to about 6 milliTorr, and a metered flow of a process gas or gases is supplied through the gas distribution assembly and into the chamber. The chamber pressure is controlled by directly measuring the chamber pressure and feeding this information to a controller that opens and closes the valves to adjust pumping speed. Gas flows/concentrations are controlled directly by mass flow controllers through a software set point provided in a process recipe. By measuring the flow rate of gases being pumped out of the chamber through the exhaust port 54, a mass flow controller (not shown) on the inlet gas supply can also be used to maintain the desired pressure and gas concentration in the chamber.

Chamber Lid Assembly

The chamber lid assembly 34 is generally comprised of an energy transmitting dome 32, an energy delivery assembly 62 and a temperature control assembly 64 supported on a hinge mounted base plate 33. The base plate 33 defines an inner annular channel in which a gas distribution ring is disposed. O-ring grooves are formed in the top of the gas distribution ring to receive an o-ring to seal the dome 32 and the top of the gas distribution ring. In combination, the lid assembly provides both the physical enclosure of the plasma processing region as well as the energy delivery system to drive processing. A cover is preferably provided over the entire lid assembly to house the various components.

The dome 32 is generally comprised of a cylindrical sidewall 66 which is closed on one end by a flat top 68. The cylindrical sidewall is generally perpendicular to the upper surface of the substrate support member 16 and the planar top 68 is generally parallel to the upper surface of the support member 16. The junction 70 between the sidewall and the top is rounded to provide a curved inner wall of the dome 32. The dome 32 is made of a dielectric material which is transmissive to RF energy, preferably a ceramic such as aluminum oxide ($Al_2O_3$), aluminum nitride (AlN) or quartz ($SiO_2$).

Two separately powered RF coils, a top coil 72 and a side coil 74, are wound external to a dielectric dome 32. The side coil 74 is preferably covered by a ground shield to reduce electrical crosstalk between the coils 72 and 74. The RF coils 72 and 74 are powered by two variable frequency RF sources 76 and 78.

Each power source includes a control circuit which measures reflected power and which adjusts a digitally controlled synthesizer in the RF generator to sweep frequencies, typically starting at 1.8 MHZ, to minimize the reflected power. When the plasma ignites, the circuit conditions change because the plasma acts as a resistor in parallel with the coil. At this stage, the RF generator continues to sweep the frequency until a minimal reflected power point is again reached. The power source circuitry is designed so that each set of windings resonates at or near the frequency at which the minimum reflected power point is reached, so that the voltage of the windings is high enough to drive sufficient current to sustain the plasma. Thus, frequency tuning guarantees that the system remains close to resonance even if the resonance point of the circuit changes during processing. In this way, frequency tuning eliminates the need for circuit tuning and impedance matching by varying the values of impedance matching components (e.g., capacitors or inductors).

Each power source ensures that the desired power is delivered to the load despite any impedance mismatches, even continuously varying impedance mismatches which can arise due to changes in the plasma impedance. To ensure that the correct power is delivered to the load, each RF generator dissipates the reflected power itself and increases the output power so that the delivered power remains at the desired level.

FIGS. 2(*a*),(*b*) and (*c*) show three separate local RF match configurations schematically. FIG. 2(*a*) shows a matching configuration for use with a coil L having one end grounded. The two capacitors C1 and C2 form an RF voltage divider. In FIG. 2(*b*), a balanced coil L having two shunt capacitors C2 and C3, where C2≈C3, across it to ground is used to match the load (plasma) frequency. Finally, in FIG. 2(*c*), a pi ($\pi$) network match is used having two variable capacitors to ground across the coil L. Since the output impedance of most conventional RF generators is designed to be 50 ohms, matching networks 2(*a*), (*b*) or (*c*) can be used to transfer maximum power to plasmas ranging in impedance from as low as 5 ohms to as high as 900 ohms (in the balanced load case). This dual coil system allows control of the radial ion density profiles in the reaction chamber.

FIG. 3 is a schematic side view of the chamber showing principally the coil geometry and RF feeds for top coil 72 and side coil 74. The pi network matching system described in FIG. 2(*c*) is shown in FIG. 3. A Langmuir probe was introduced into the chamber 13 to measure the plasma ion density at different positions across the chamber 13 using the top coil only, and the side coil only, to generate the plasma. The dual coil arrangement, when properly tuned to a substrate being processed, can generate uniform ion density across its surface. Uniform ion across the substrate surface contributes to the uniform deposition and gap-fill performance onto the wafer and helps alleviate plasma charging of device gate oxides due to nonuniform plasma densities. When the action of the coils is superimposed, uniform plasma density results and deposition characteristics may be vastly improved.

Figure 4:
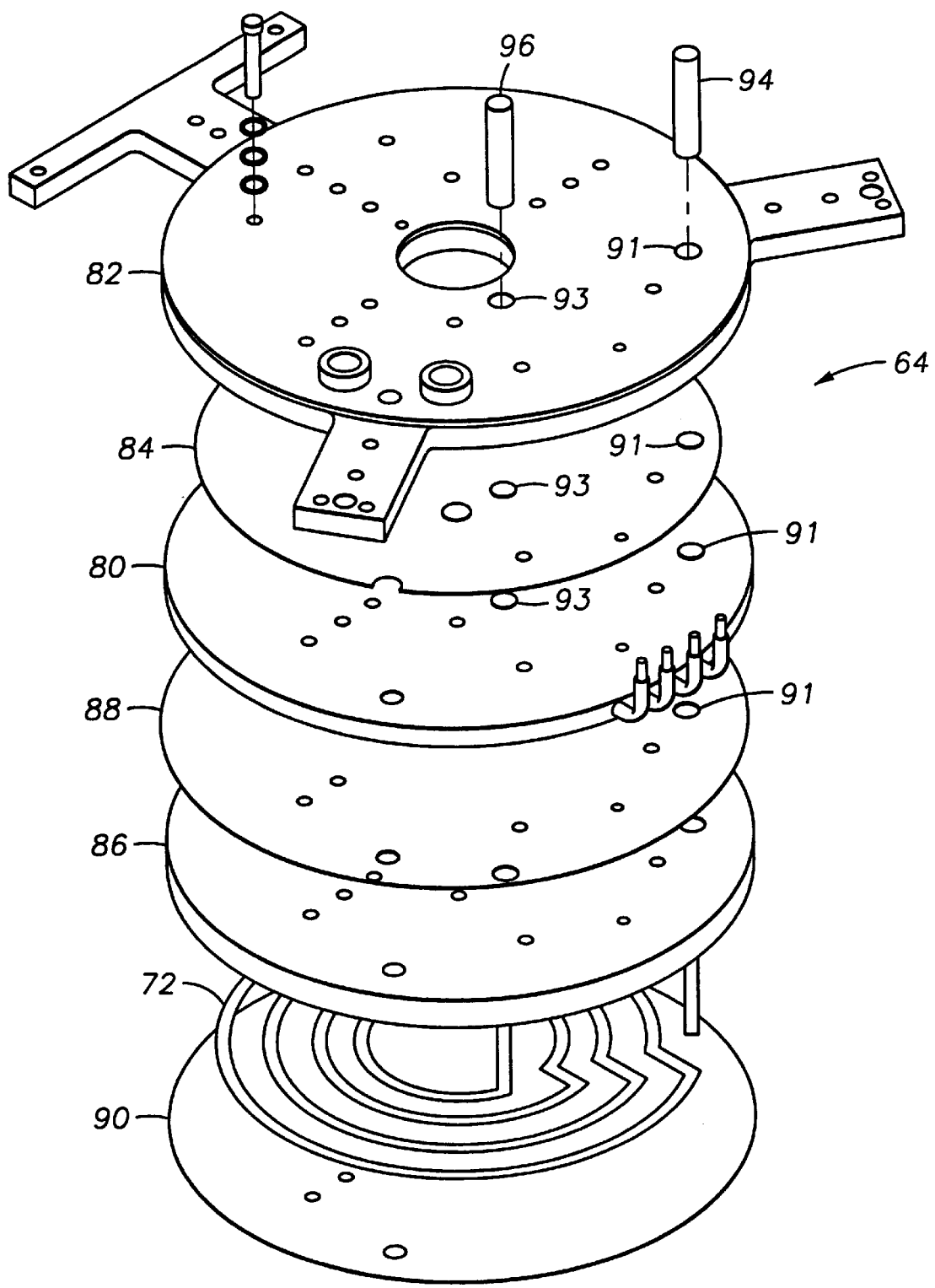
FIG. 4 is an exploded view of the top temperature control assembly and top antenna.

The dome 32 also includes a temperature control assembly 64 to regulate the temperature of the dome during the various process cycles, i.e., deposition and clean. FIG. 4 is an exploded view of the temperature control assembly 64 and the top coil 72. The temperature control assembly generally comprises a heating plate 80 and a cooling plate 82 disposed adjacent each other and preferably having a thin layer 84 of a thermally conductive material, such as grafoil, disposed therebetween. Preferably, about a 4 mil to about 8 mil layer of grafoil is disposed therebetween. A thermally conductive plate 86, such as an AlN plate, is provided with grooves formed in its lower surface to house the coil 72. A second layer 88 of grafoil, preferably about 1 to about 4 mils thick, is disposed between the thermally conductive plate 86 and the heating plate 80. A third thermally conductive layer 90 is disposed between the coil 72 and the dome 32. The third layer is preferably a layer of chromerics having a thickness of about 4 mils to about 8 mils. The thermally conductive layers facilitate heat transfer to and from the dome 32. During cleaning it is preferred to heat the dome, while during processing it is preferred to cool the dome. As a result, a thermally conductive path is provided to achieve these advantages.

The cooling plate 82 includes one or more fluid passages formed therein through which a cooling fluid such as water is flown. The water channel in the cooling plate is in series with cooling channels 88 formed in the chamber body. A pushlock type rubber hose with quick disconnect fittings supplies water to the chamber body and the cooling channel in the lid. The return line has a visual flowmeter with an interlocked flow switch. The flowmeter is factory calibrated for a 0.8 gpm flow rate at a pressure of about 60 psi. A temperature sensor is mounted on the dome to measure the temperature thereof. The heating plate 80 preferably has one or more resistive heating elements disposed therein to provide heat to the dome during the cleaning phase. Preferably the heating plate is made of cast aluminum, however other materials known in the field may be used. A controller is connected to the temperature control assembly to regulate the temperature of the dome.

Each of the components 80, 82, 84, 86, and 88 define two channels through which the ends of the top coil 72 extend. Two insulative sleeves 94, 96 are disposed in each channel formed in the heating plate 80, the cooling plate 82 and the grafoil layers to insulate the coil leads extending therethrough. The insulative sleeves may include silicon suction cups disposed on their lower ends to provide a seal at the insulative plate 86.

By direct conduction, the heating plate 80 and the cooling plate 82 are used to control the dome temperature. Control of the dome temperature to within ≅10° K. improves wafer to wafer repeatability, deposition adhesion and has been found to reduce flake or particle counts in the chamber. The dome temperature is generally kept within the range of from about 100° C. to about 200° C. depending on processing requirements. It has been shown that higher chamber clean rates (etch rates) and better film adhesion to the substrate can also be obtained at higher dome temperatures.

Cathode and Lift Assembly

Figure 5:
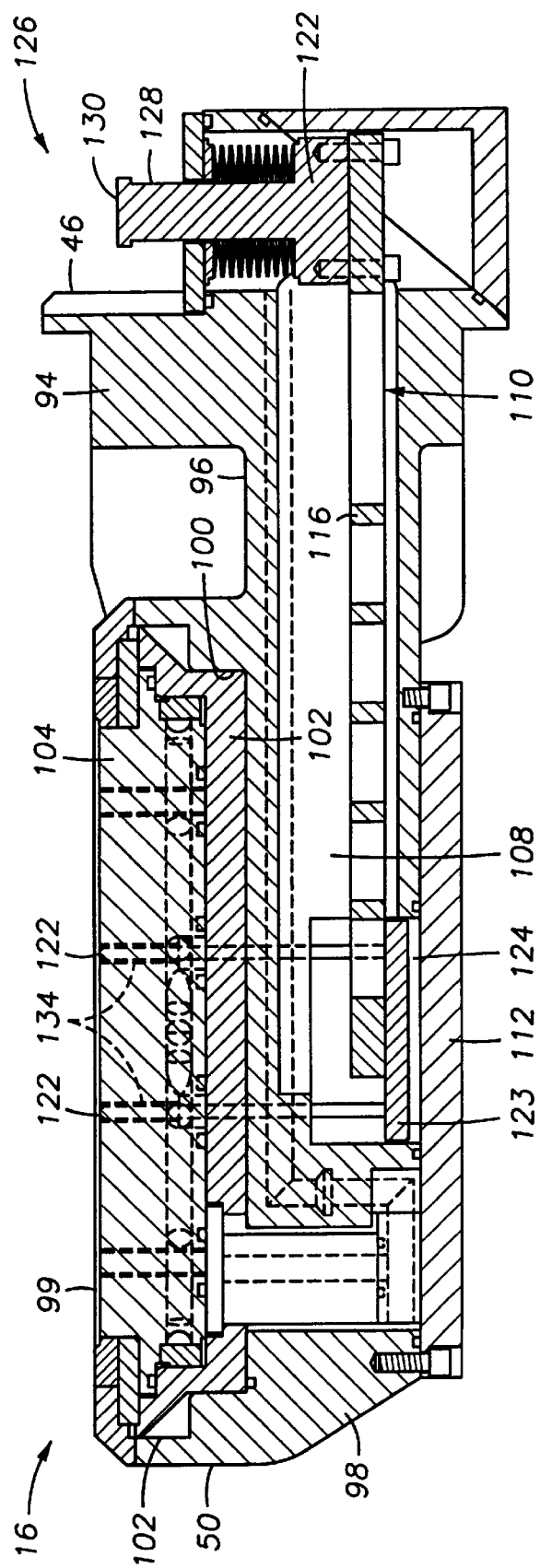
FIG. 5 is a cross sectional view of a substrate support member of the present invention.

The cathode and lift assembly will now be described with reference to FIGS. 5–10. The support member includes elements which are positionable within the chamber and elements positionable outside of the chamber. The elements of the support member 16 positionable within the chamber extend through access port 26 provided in the sidewall 18 of the chamber and are supported to the sidewall by elements positionable outside of the chamber. FIG. 5 is a cross-sectional view of the substrate support member 16. The support member 16 generally includes a base 94 having a flange 46 for attachment to the chamber wall, a cantilevered arm portion 96 extending radially inward therefrom, and a substrate receiving portion 98 located at the end of the cantilevered arm 96. The flange 46 mounts the base 94 of the support member to the chamber wall 18 about the substrate support member access port 26. The base 94 extends inwardly from the flange 46 to define an inner curvilinear wall portion 51. The curvilinear wall 51 is preferably an arc or segment of a circle having a radius (r) substantially equal to the overall inner radius (R) of the chamber. The surface of the curvilinear wall 51 in the circumferential direction is received adjacent the inner wall 52 of the chamber. The curvilinear wall 51 along with the inner wall 52 of the chamber form a symmetrical and continuous inner chamber wall when the support member 16 is located in the chamber for processing as shown in FIG. 7.

The cantilevered arm 96 extends inwardly from the lower portion of the base 94 to support the ESC receiving portion 98 having a substrate receiving surface 99 thereon. The ESC receiving portion 98 includes an upwardly extending annular pilot 100. The annular pilot 100 includes a larger inner diameter portion and a smaller inner diameter portion which form an inner annular step to support an insulative member 102 thereon. An ESC 104 is preferably supported on insulative plate 102 to provide a substrate receiving surface 99. The outer wall 50 of the ESC receiving portion 98 defines a continuous annular face.

The ESC receiving portion 98 also defines a recess 108 in which a substrate positioning assembly 110 is disposed. A bottom plate 112 is secured to the lower portion of the receiving portion by a threaded screw arrangement to protect the inner components of the support member 16 from the processing environment.

Figure 7:
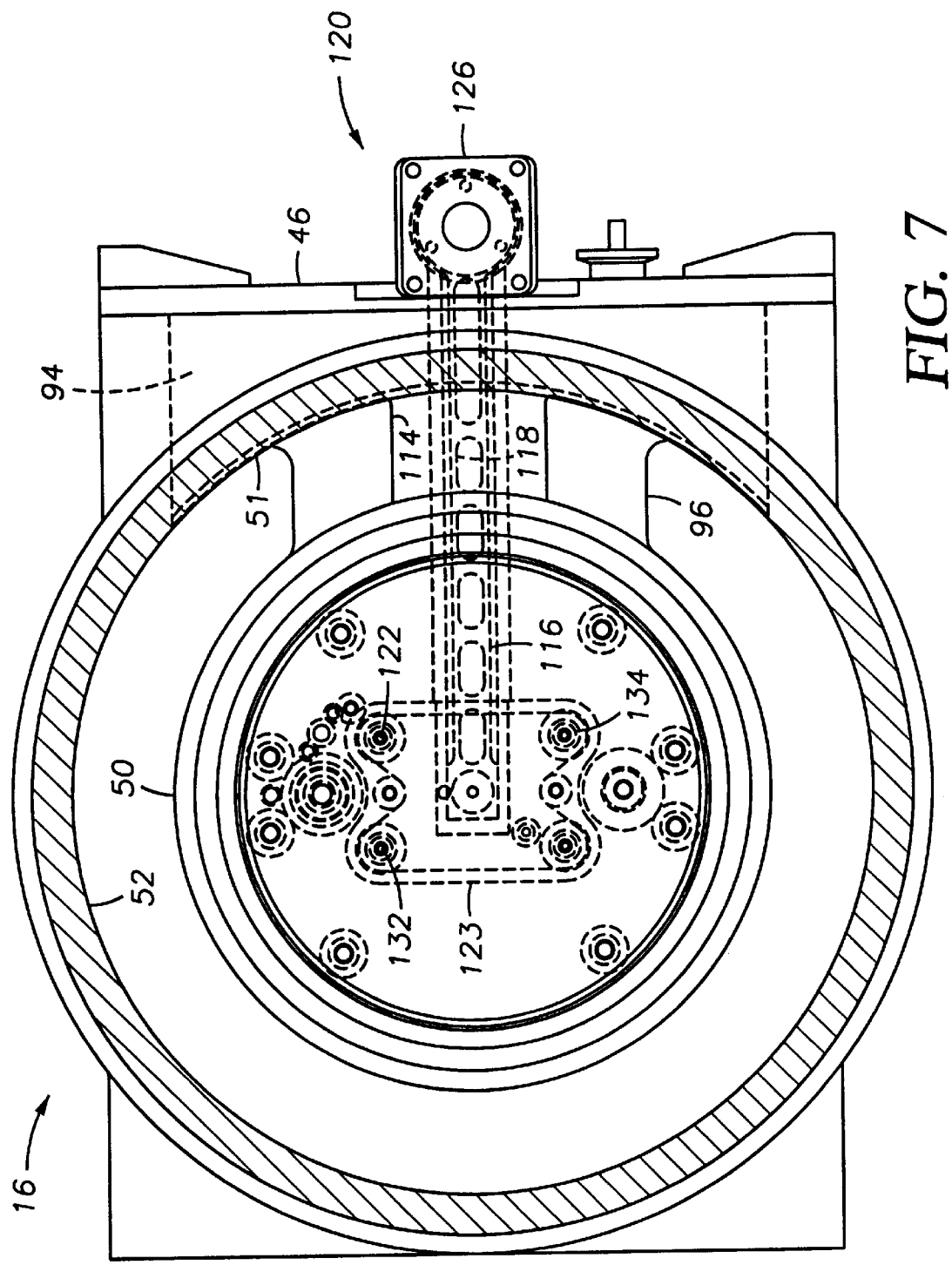
FIG. 7 is a top cross sectional view of a chamber having a substrate support member disposed therein.

FIG. 7 is a top sectional view showing a support member 16 disposed in a chamber. The cantilevered arm 96 extends across the symmetric fluid passage 22 to support the ESC receiving portion 98 within the chamber. It is preferred that the cantilevered arm minimize interruption, restriction or disturbance of the fluid flow through the fluid passage 22 by including a fluid passage or plurality of passages 114, such as a radial passage, therethrough. It is also preferred that the support arm 116, include a passage or plurality of passages 118 therethrough to minimize interruption, restriction or disturbance of fluid flow through the uniform fluid passage.

It is also preferred that the cantilevered arm 96 attach to the ESC receiving portion 98 at a point remote from the substrate receiving surface, such as along the bottom of the ESC receiving portion 98, in order to further minimize the effect on the gases near the surface of the substrate caused by any interruption, restriction or disturbance of fluid as it passes through and around the cantilevered arm. More generally, it is preferred that any nonuniformity in the fluid passage 22 be minimized and positioned a sufficient distance from the ESC receiving surface 98 to avoid affecting the flow of fluid over a substrate placed thereon.

The substrate lift assembly 120 includes a plurality of radially extending substrate support pins 122 which are aligned with and spaced about the periphery of the ESC receiving member 98 and are received on a winged mounting plate 123. The mounting plate 123 is disposed within a generally rectangular recess 124 formed in the support member 16, and is actuated by a vertically moveable elevator assembly 126. As shown in FIG. 5, the elevator mechanism 126 includes a vertically moveable shaft 128 that mounts a plate 130 at the upper end thereof. The shaft 128 is moved vertically up and down by an actuator, preferably a pneumatic cylinder located outside of the chamber.

The support pins 122 are received in sleeves 132 located in bores 134 disposed vertically through the ESC receiving member 98 and move independently of support member 16 within the enclosure. Support pins 122 extend from the support member 16 to allow the robot blade to remove a substrate from the enclosure, but must sink into the support member 16 to locate a substrate on the upper surface of the ESC 104. Each pin includes a cylindrical shaft terminating in a lower spherical portion and an upper spherical portion.

In operation, an external blade 138 (with a substrate to be processed supported thereon) is inserted through the slit valve 24 into the chamber to position a substrate over the support member 16. One example of a suitable blade 138 and an associated robot substrate handling system is described in co-pending, commonly assigned U.S. patent application Ser. No. 944,803, entitled "Multichamber Integrated Process System", filed in the name of Dan Maydan, Sasson Somekh, David N. K. Wang, David Cheng, Masato Toshima, Isak Harari, and Peter Hoppe, which is hereby incorporated herein by reference. The elevator mechanism 126 raises the substrate support pins 122 above the blade to pick up the substrate. The blade is then withdrawn from the chamber and a pneumatic cylinder closes a door over the blade access slot to seal chamber. The elevator mechanism 126 is actuated to lower support pins 122 until the substrate is received on the upper surface 98 of the support member 16 in position for processing.

After processing, the elevator mechanism raises the support pins 122 to lift the substrate off the substrate support member 16. The door is then opened and the blade is again inserted into the chamber. Next, elevator mechanism 126 lowers the substrate support pins 122 to deposit the substrate on the blade. After downwardly moving pins 122 clear the blade, the blade is retracted.

Figure 6:
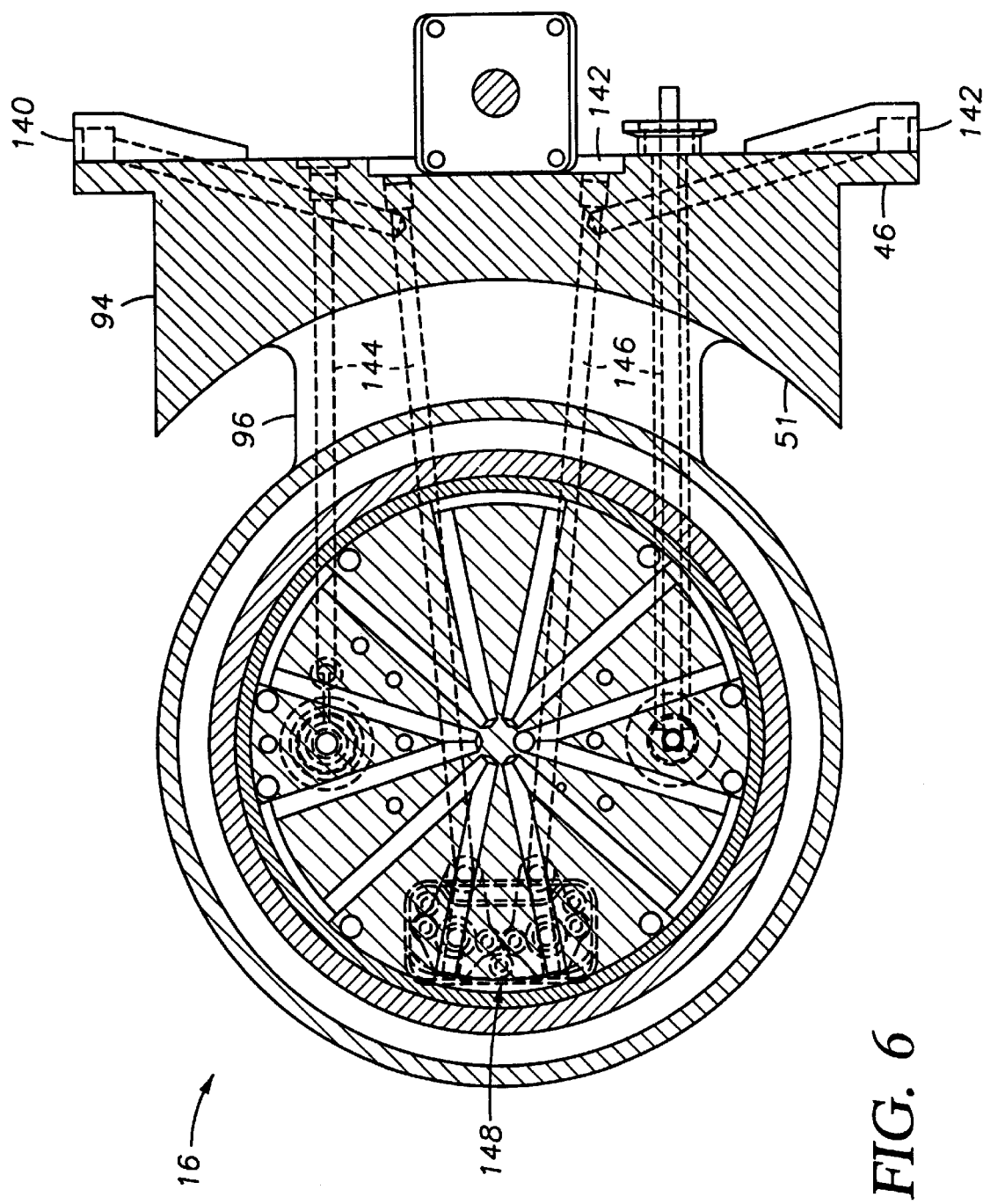
FIG. 6 is a top cross sectional view of a substrate support member of the present invention.

During processing, the plasma of the CVD process environment gives off large quantities of heat, the total heat generated by the plasma being at least partially dependent on the power density of the plasma. A portion of this heat is transferred into the substrate, and must be removed from the substrate to maintain the temperature of the substrate, below a pre-defined critical temperature. To remove this heat, a heat transfer system is provided in the substrate support member 16 to control the temperature of the support member and the substrate being processed. FIG. 6 is a top sectional view showing the heat transfer system of the support member 16. Water inlet 140 and outlet 142 are connected by passages 144 and 146. A water manifold 148 is located within the support member 16 to facilitate heat transfer from the support member to the coolant fluids. The temperature of the support member 16 is selected to eliminate premature deposition within the gas manifold upstream from the processing region of the chamber. Coolant channels 144, 146 received through the mass of the substrate support member 16 are provided for the passage of coolant fluids therethrough. In addition, grooves in the surface of the ESC 104 (which will be described below), wherein gases are flown, transfer heat from the substrate into the support member 16 and subsequently into the coolant fluids.

Figure 8:
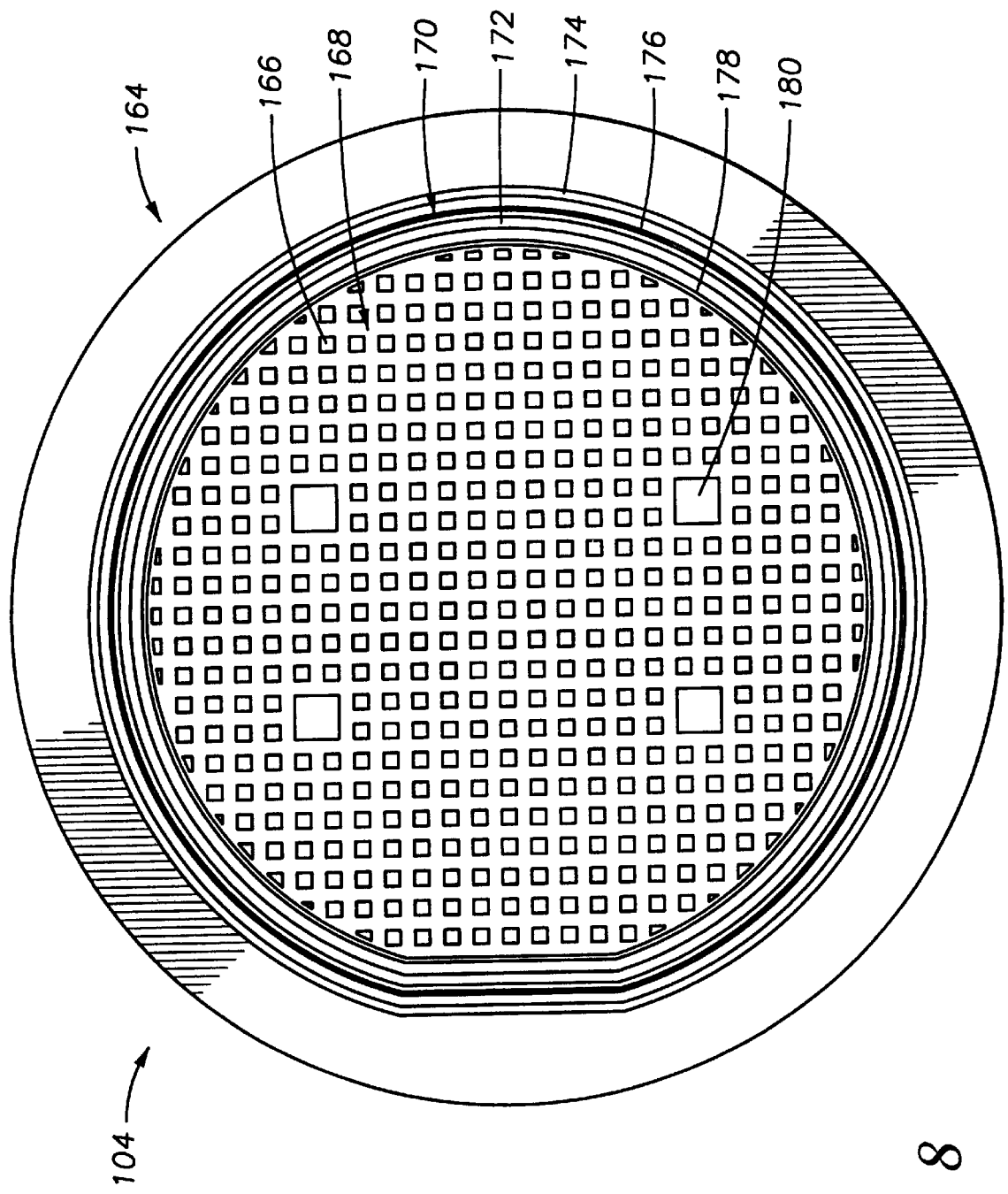
FIG. 8 is a top view of one embodiment of an electrostatic chuck.
Figure 8A:
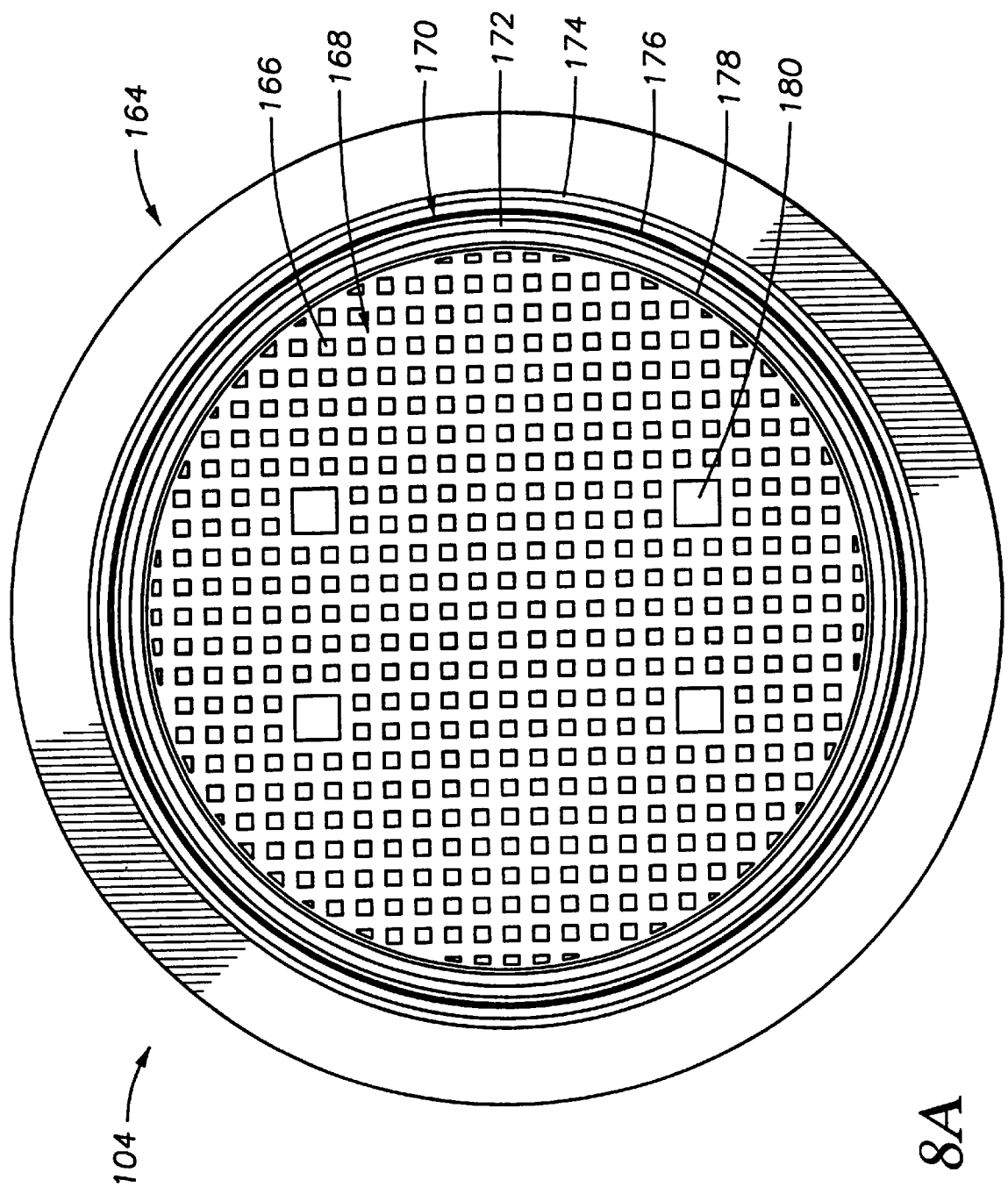
FIG. 8a is an alternative embodiment of the electrostatic chuck.

FIG. 8 is a top view of one embodiment of an electrostatic chuck 104 according to the present invention. FIG. 8a is an alternative embodiment which is symmetric and eliminates a wafer flat area. Instead of having a smooth top surface, a number of grooves are provided in the surface to form a large number of protrusions 166. A central zone 168 of these protrusions is separated from a peripheral zone 170 by a seal 172. Seal 172 is simply an area which has not had grooves formed in it to provide protrusions, thus forming a solid surface to minimize flow between separate zones. An outer seal 174 provides a barrier to minimize leakage of helium gas into the chamber.

Helium gas is inserted into periphery zone 170 through a ring 176 which is a groove having a series of holes in it which receive higher-pressure helium into this zone from helium line 47 of FIG. 1. An inner ring 178 allows a lower pressure gas to the central zone 168 from pressure helium line 147. In operation, after establishing an initial low helium pressure in central zone 168, helium ring 178 typically will be removing helium gas leaking through seal area 172 to maintain the desired low pressure helium. In an optional embodiment, vacuum holes 180, which may be lift pin holes, can be used to pump out the gas in the central zone using vacuum line 135 of FIG. 1 to further lower the pressure in the central zone. Optionally, additional vacuum holes could be added.

Helium groove 178 is preferably positioned near seal area 172. By positioning it as close as possible, the desired heat transfer step function can be approached. The high pressure gas is thus contained in a narrow region by the periphery. If the high pressure gas extends too far toward the center of the wafer, the cooler center will become even cooler, partially offsetting the reduction in heat differential provided by the higher pressure gas.

In operation, for heating the wafer, lower pressure helium (1–15 torr) is provided into the central zone 168, and higher pressure helium (1–20 torr) is provided to peripheral zone 170. The higher pressure helium in the peripheral zone provides better heat transfer at the periphery of the wafer.

In one embodiment, the seals are made of the same ceramic coating as the remainder of the top of electrostatic chuck 164. Such a ceramic coating has small interstices, and thus the seal areas do not provide a perfect seal. In addition, the substrate or wafer will have some backside roughness, and may have more roughness than the substrate support. Accordingly, the seal area should have sufficient width to prevent significant leakage of helium from one area to the other. It has been determined by testing that for a ceramic covered electrostatic chuck with the pressure ranges set forth above, that a seal width of 1/10 inch, or 100 mils, is effective. Preferably, the seal width is in the range of 50 to 300 mils. For the outer seal 174, it is desirable to minimize the width because the area of the wafer above this seal will not have the benefit of the heat conduction from the high-pressure helium. At the same time, the seal must be wide enough to prevent significant leakage of helium into the chamber which could undermine its intended heat transfer capability by reaching the sustained helium pressure due to higher flow levels or affect the reaction in the chamber. The same 100 mil width has been found effective, with an optimum seal width being in the range of 50 to 300 mils. Alternate widths may be appropriate for different materials and smoothness of the substrate support and substrate. For example, if a polymer film, such as Kapton™, available from many well-known suppliers, is used, a small width can be achieved because of its compliancy.

A preferred heat transfer gas is helium because it is inert and relatively inexpensive. Alternately, argon, oxygen, $CF_4$, or other gases could be used, or a mixture of gases may be used. A mixture could be used, for instance, to give additional pressure control capabilities. The particular gas could be chosen to be compatible with the chemical process in the chamber so that any leaking gas will have minimal effect on the chemical reactions. For example, in an etching reaction using fluorine as an etching species, it may be desirable to use $CF_4$ as the backside heat transfer gas.

Because heat conduction occurs primarily through the helium gas, it is desirable to minimize the size and number of the protrusions and seal areas for this purpose. Thus, there should be less contact area than non-contact area over the area of the substrate. On the other hand, the seals are required to prevent gas leakage and the protrusions must be of sufficient size and spacing to mechanically support the wafer. In addition there are other factors to be optimized. The height of the protrusions, which determine the gap between the substrate and the substrate support between the protrusions, must be sufficient to allow the gas to quickly become distributed throughout the zones without affecting a process start up time. Typically, this must be on the order of a few seconds, and preferably the gas is distributed in 10 seconds or less.

For optimum heat transfer, the gap should be small enough so that heat transfer primarily occurs by molecules traveling directly from the substrate to the substrate support without colliding with another gas molecule, giving free molecular heat transfer. Thus, the gap should be less than the mean free path of the gas (or the average free path if a mixture of gases is used). The mean free path is a function of the pressure of the gas and the molecular collisional cross-section. Where a variety of pressures will be used, the mean free path will vary. In a preferred embodiment, the mean free path of the maximum pressure to be applied is used to determine the gap dimension.

In addition, the ratio of the gap to the overall dielectric thickness must be kept small to avoid local anomalies on the substrate. If this ratio is significant, the equivalent capacitance will vary significantly between the spaces and the protrusions, applying a significantly different electric field to the substrate. This different field can affect the chemical process, causing nonuniformities in the film that is being deposited, etched, doped, or undergoing other property transformations. Some difference will necessarily be present, but it is desirable to minimize this.

The significance of the ratio also varies depending on the dielectric material, in particular the difference between the dielectric constant of the material and the heat transfer gas (essentially one). The closer the two dielectric constants, the less the concern with a larger gap.

Another concern in setting the gap size is to avoid having a plasma generated with the heat transfer gas between the substrate support and the backside of the wafer. It is believed that this would begin to be a concern if the gap size were several times the mean free path of the heat transfer gas.

For one embodiment of an electrostatic chuck, the thickness of the ceramic coating is on the order of 7–10 mils. If Kapton™ is used, a thickness of 1–2 mils may be used. Ideally, for chucking purposes, the dielectric is as thin as possible within the limits of maintaining manufacturing consistency and avoiding dielectric breakdown. The mean free path of helium at the pressures for the two zones described above is about 1–5 mils (at very high pressures, the mean free path may be less than one). Accordingly, protrusion heights of 0.7–1.2 mils have been chosen, tested, and found effective. This gives a gap less than the mean free path of helium at the desired pressures. Preferably, the gap is less than twice the mean free path of the heat transfer gas at the pertinent pressures, and more preferably less than the mean free path.

The spacing between the protrusions is as large as possible while still supporting the substrate without bowing. In one embodiment, the substrate is kept planar, while in other embodiments it may be desirable to vary the protrusion height, or alternately the top surface of the substrate support (with the protrusions of equal height), to properly support a curved substrate. Another factor is avoiding sharp points that could cause local anomalies in the electric field. Too large a spacing can also affect the movement of charge during dechucking, causing damage.

It has been determined that an optimum center-to-center spacing of the protrusions is in the range of 100–300 mils, more preferably approximately 300 mils. The size of the protrusions themselves is preferably between 10 and 150 mils, more preferably approximately 130 mils in diameter. Square protrusions are shown simply because of their ease in manufacture, and other shapes could be used as well. Annular shapes could be used, for example.

In the embodiment shown, no openings for removing gas are shown in the outer peripheral region, although this can be provided in an alternative embodiment. The control of helium pressure can be done either by providing high or low pressure helium, or by more pumping through a vacuum pump. Similarly, for the central region, the pressure can be controlled in either of these ways or through a combination of both. The placement of the helium source as a ring near the edges in combination with a vacuum near the middle of the support provides an additional pressure gradient within the central region, decreasing towards the center. An alternate embodiment of the present invention thus provides a coarse adjustment of the heat transfer through the two pressure zones, with a fine tuning occurring through the placement of the helium inlet and vacuum outlets in the central portion. In alternate embodiments, more than one zone could be used for finer adjustments, with the trade off of requiring more hardware.

Figure 9:
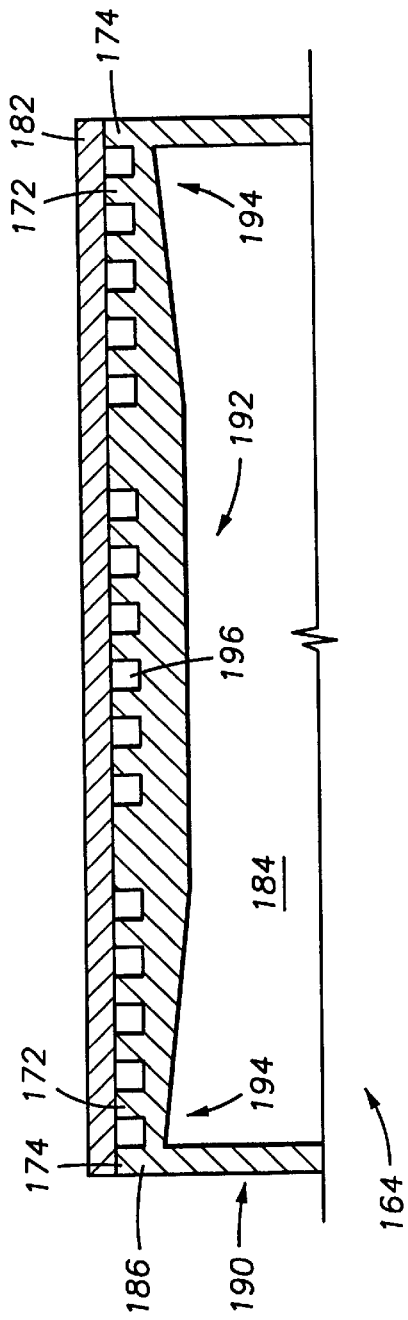
FIG. 9 is a cross sectional view of one embodiment of the electrostatic chuck of FIG. 8.

FIG. 9 is a side view of one embodiment of an ESC 104 showing a varying dielectric thickness of a dielectric 186. A wafer 182 is shown mounted on the chuck. The chuck includes an electrode portion 184 covered by dielectric 186. The dielectric extends across the top and along the sides 190 of the electrostatic chuck. As can be seen, the dielectric is thicker at a central portion 192, and thinner at peripheral portions 194. The side view shows the multiple protrusions 170 and also shows the inner seal 172 and the outer seal 174.

The thinner dielectric at peripheral portions 194 provides a stronger electrostatic force at these portions. This is beneficial for a number of reasons. First, it holds the wafer more tightly, ensuring better heat transfer by providing better contact with the top of the electrostatic chuck. Second, a tighter force helps hold in the higher pressure helium between seals 172 and 174 near the periphery. In addition, if the peripheral portion of the wafer has a temperature different from the central portion, this may cause it to bend relative to the central portion, and it may bow up or down, further exacerbating the heat differential problem. This can be overcome by an appropriately higher electrostatic force at the peripheral portion.

In an alternate embodiment, the varying dielectric thickness can be used without the two pressure zones, or without the protrusions. The varying in the dielectric coating can be continuous, or stepwise. A stepwise difference makes the manufacturing simpler and less expensive.

Another advantage of the seal area 174 and the stronger electrostatic force at the edge of the wafer is to prevent arcing of the plasma to exposed metal near the top surface of the electrostatic chuck. Such exposed metal would typically be at the helium inlet ports, which would come up through the aluminum electrode, thus exposing through those holes a path to the electrode. Arcing is prevented by providing a tighter seal, locating the helium inlet holes sufficiently away from the edges of the electrostatic chuck, or putting a groove there to prevent such arcing.

As shown in FIG. 9, a temperature sensor 196 can be placed in the space between the top surface of the electrostatic chuck and the wafer. The temperature of the wafer can thus be inferred from the sensor.

Figure 10:
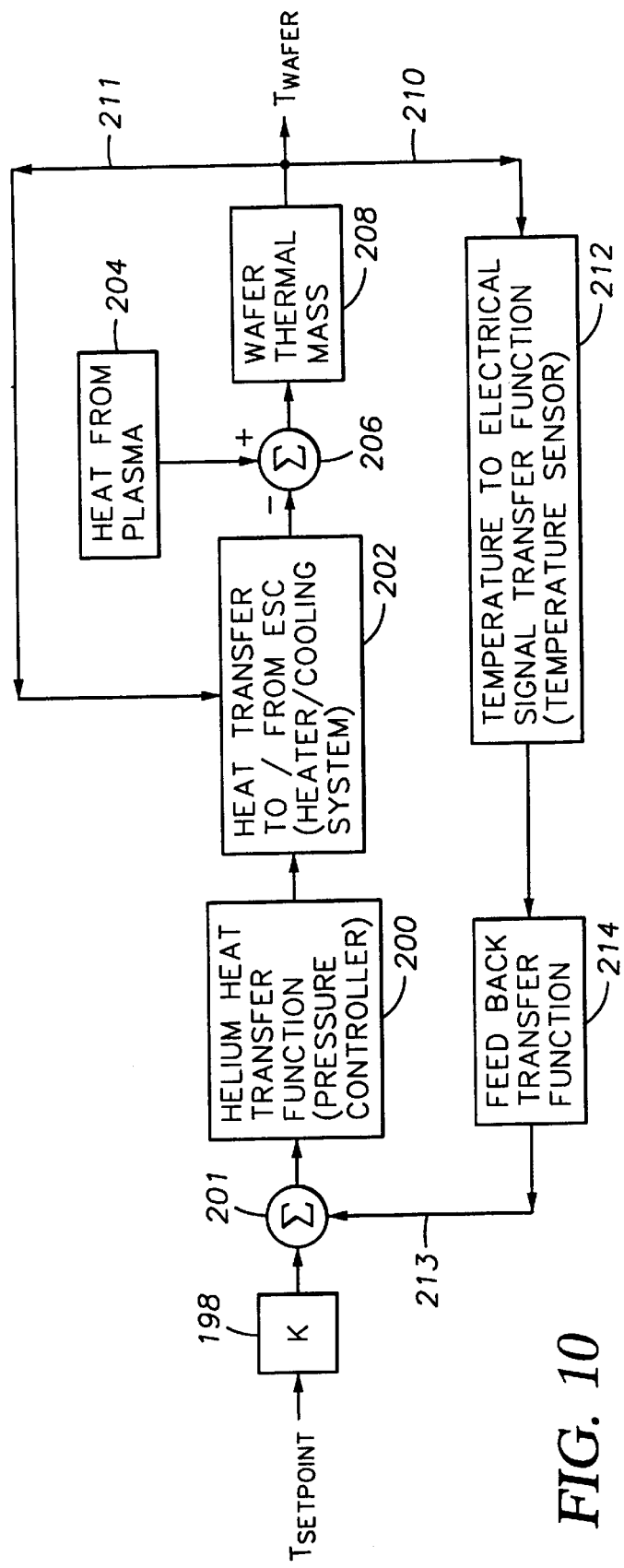
FIG. 10 is a flow diagram of the temperature control aspects of the electrostatic chuck of FIG. 8 and 9.

FIG. 10 is a feedback control system signal flow diagram illustrating the temperature control. The FIG. 10 diagram is for a closed loop temperature control system for controlling the helium pressure. Alternately, an open loop system could be used without the temperature sensor. Prior experimentation could dictate the appropriate helium pressure for the desired process parameters, and thus the temperature sensor could be eliminated in an alternate embodiment. FIG. 9 contains both functions performed in a processor, and physical effects.

A temperature set point is provided as a user-programmed input to a controller from a control program in a memory 245. The temperature set point value is multiplied by a constant 198 by the controller, which adds the result to a feedback signal 213 as indicated by an add function 202. The result of the add function is used by the controller to control the helium pressure by controlling flow restrictors or valves in the helium supply. This varies the extent of the heat transfer of the helium gas. In a preferred embodiment, the helium pressure is controlled according to a mathematical model; however, empirical results could also be used as the basis of the pressure control. The mathematical model is described below. The helium pressure controls the heat transfer to the ESC as indicated by block 202 (alternately, any type of substrate support may be used). The ESC is either cooled by heat exchanger 233, or heated by heater 243, with the amount of heat transfer to the wafer controlled by the helium pressure. This heat transfer can be offset by the heat generated by energy transferred from the plasma (as illustrated by block 204), which combines (as illustrated by block 206) with the heat transfer to the ESC. The total heat transfer, applied to the wafer thermal mass (as illustrated by block 208), produces the temperature 210 of the wafer. Note that alternate substrates may be used rather than a semiconductor wafer. The final temperature 210 of the wafer also impacts the amount of heat transfer to the electrostatic chuck, as indicated by feedback line 211. The heat transfer function between the ESC and the wafer indicated in block 202 is a function of the temperature of the wafer, as well as the temperature of the ESC. As shown, the heat transfer to the ESC removes heat from the wafer while the heat from the plasma adds heat to the wafer. However, these can be reversed when the electrostatic chuck is used to heat the wafer, and thus provides heat input while heat is removed due to the plasma at a lower temperature, or simply by the chamber in the absence of a plasma.

A block 212 illustrates the transformation of the temperature into an electrical signal by the temperature sensor. Block 214 illustrates the transfer function applied in the processor before combining the temperature signal with the temperature set point as a feedback. Such a transfer function could in its simplest form be a multiplication by a constant, which could be unity, or simply a transformation from an analog signal to a digital signal.

The functions performed by the controller are done under the control of a program in memory 245. That program will include instructions for performing the various steps, such as instructions for reading the temperature indication from the temperature sensor, an instruction for comparing that temperature to the desired input set temperature, and an instruction for controlling the pressure valve (or flow restrictor) to vary the pressure of the gas in a particular pressure zone. Other instructions are provided to shut off the gas in the event of a fault, etc.

The helium pressure can be controlled by increasing or decreasing the pressure where a simple one pressure electrostatic chuck is used. Alternately, where two pressure zones are used as in the preferred embodiment of the invention, the outer and inner helium pressures can be controlled separately. The temperature of each region can be inferred from a single temperature sensor which may be placed, for instance, near the intersection of the two zones. Alternately, two different temperature sensors could be used. In other alternate embodiments, the temperature sensor could be attached to the top surface of the electrostatic chuck, or alternately be put in direct contact with the wafer itself. The temperature sensor may be used to infer the pressure, such as where there is leakage between zones causing a pressure variance. A pressure regulator may detect only the pressure at its output, which would typically be some distance from the wafer, which could thus have a different pressure under it. A temperature sensor could be used to infer the actual pressure under the wafer. Depending on the wafer surface roughness, the leakage could vary, and the pressure provided may need to be varied.

The control system typically will have certain constraints on it. For instance, the helium pressure is limited so that the wafer is not lifted off the electrostatic chuck, or so much of a pressure differential is provided to cause a thermal gradient that damages the wafer due to thermal stress. In the event that such constraints are exceeded, or some other defined fault occurs, the gas flow is stopped.

Process Kit

The process kit is comprised of a collar and a cover. Additionally, a skirt may also be used. The ceramic collar is wafer size and type specific and is disposed between the electrostatic chuck and the quartz cover. The primary purpose of the collar is to protect the electrostatic chuck flange from the effects of the plasma. The cover extends from the collar to the outer periphery of the cathode assembly and its primary purpose is to protect the cathode assembly from the effects of the plasma. A skirt may be disposed on the lower chamber to protect the spacer and o-ring which seal the upper and lower chamber from the effects of the plasma In one aspect, the present invention provides an improved process kit or shield for an electrostatic chuck in a semiconductor processing chamber that inhibits or resists the deposition of gaseous products thereon. In addition, the shield provides faster removal of oxide deposition which results in enhancing the throughput of the wafer manufacturing process.

In one embodiment, the collar or cover may include a conducting material disposed on one or more surfaces or therein to enhance cleaning of its surface. Generally, the inductive coils disposed about the dielectric dome 32 are used to heat the conducting material in or on the collar or cover which then results in heating the collar or cover surfaces. It has been shown that in situ cleaning processes performed using fluorinated chemistry or other reactive gases is enhanced at elevated temperatures. Using the inductive coil and a conductor disposed in or on the process kit components elevates the temperature of the surfaces of these components to increase cleaning rates.

As one example, a metal can be deposited on one surface of a process kit component, such as a collar or cover, to provide a conductor in which a current can be induced. The operation of the heating process is similar to that which is seen in a transformer with the coil being the external winding and the metal layer being the internal winding.

FIG. 11 is a cross-sectional view of a electrostatic chuck and a processing kit. A substrate support assembly 230 comprises a support body 232 preferably fabricated as an integral block from an electrically conducting material having a high thermal mass and good thermal conductivity to facilitate absorption of heat from a wafer cooled over its upper surface. Aluminum or anodized aluminum is the preferred material for support body 232 because it has a high thermal conductivity of approximately 2.37 watts/cm-°C. and it is generally process compatible with the semiconductor wafer. Support body 232 may comprise other metals, such as stainless steel or nickel, and support body 232 may comprise an additional non-conducting material or the entire support body 232 may comprise a non-conducting or semi-conducting material. In an alternative embodiment, support body 232 comprises a monolithic plate of ceramic. In this configuration, the ceramic plate incorporates a conducting element imbedded therein. The conducting element may comprise a metallic element, green printed metalization, a mesh screen or the like. Support body 232 defines an annular mounting flange 234 extending outwardly from the outer surface of support body 232. A voltage, preferably about 700 Volts, is is applied to the substrate support assembly 230 by a DC voltage source (not shown) to generate the electrostatic attraction force which holds a wafer W in close proximity to the upper surface of support body 232.

Referring to FIG. 11, substrate support assembly 230 comprises a smooth layer of dielectric material 236 covering an upper surface 238 of support body 232 for supporting the lower surface of wafer W. Dielectric layer 236 covers the entire upper surface 238 of support body 232 except for the region overlying four lift pin holes 240. Dielectric layer 236 preferably comprises a thin ceramic dielectric layer (preferably on the order of about 0.10 to 0.30 inches) of alumina, aluminum oxide or an alumina/titania composite that is plasma sprayed over upper surface 238 of support body 232.

In one embodiment, shield 242 comprises a thin annulus of conducting material 244 deposited underneath the collar 246. The collar 246 is supported by an annular flange 234 and held by a cover 248. Cover 248 is preferably a ceramic outer jacket for covering and protecting the lateral surfaces of support body 232 to decrease the time required to clean the chamber. The collar 246 is preferably separated from annular flange 234 by a small interstitial gap 250. Gap 250 is created by the natural surface roughness of the upper surface of the annular flange 234 and the lower surface of the conducting material 244 or the collar 246. Gap 250 is preferably about 0.5 to about 5 mills thick. In the relatively low-pressure environment of the processing chamber (typically on the order of about 5 milliTorr), gap 250 establishes a thermal barrier that inhibits thermal conduction between the collar 246 and the support body 232.

As shown in FIGS. 11, the collar 246 preferably has an inner diameter larger than the diameter of support body 232 to define a second gap 252 therebetween. Gap 252 provides room for expansion of support body 232 when it is heated in the process chamber and also ensures that the shield 242 can be installed and removed without damaging the substrate support 230 or the collar 246. Collar 246 is comprised of an insulating or dielectric material, preferably ceramic or ceramic, that serves to prevent or inhibit the plasma in the processing chamber above the wafer from contacting, and thereby eroding, part of the electrostatic chuck. However, collar 246 is not necessarily limited to an insulating material and, in fact, applicant has found that a collar 246 made of a semiconducting material may effectively protect the electrostatic chuck from the plasma within the processing chamber.

The collar 246 is a thin ring 254 having a curved upper surface 256 that is exposed to deposition from gases in the process chamber. The ratio of the surface area of exposed upper surface 256 to the thermal mass of collar 246 is preferably high, usually about 0.1 to 5 cm$^2$K/J and preferably about 1 to 1.6 cm$^2$K/J. The high ratio of exposed surface area to thermal mass of collar 246 causes it to be heated to a substantially high temperature from the RF energy in the chamber. Since the oxide deposition rate is generally inversely proportional to the temperature of a surface in the process chamber, the heat received by the collar 246 inhibits oxide deposition on the exposed upper surface. Thus, the geometry of collar 246 (i.e., the high ratio of exposed surface to thermal mass) minimizes the rate of deposition on upper surface 256.

During a deposition process, oxide from process gases is deposited onto wafer W and onto a substantial portion of the exposed surfaces of the chamber, such as the inner walls of the enclosure and upper surface 256 of collar 246. Since the thermal mass of collar 246 is relatively small compared to the surface area of surface 256, collar 246 will receive a relatively large amount of heat from the RF power supply. Collar 246 is also heated by the thin annulus of conducting material 244 which generates heat through the RF power. This further decreases the rate of oxide deposition onto upper surface 72.

As shown in FIG. 11, collar 246 is preferably sized so that upper surface of collar 246 is positioned below the upper surface of the wafer when the wafer rests on or is adjacent to the upper surface of dielectric layer 236. Positioning collar 246 below the upper surface of the wafer further lowers the oxide deposition rate on upper surface 256 and provides an improved line of sight to the wafer edges. Therefore, the edges of the wafer may receive a higher deposition rate than if the shield 242 were to extend above the wafer. In some processes, this may be advantageous to compensate for the higher deposition rate in the center of the wafer that typically occurs during processing.

Referring to FIG. 12, a cross-sectional view of the process kit in a processing chamber, the source RF coil 260 in an inductive HDP source can be used to heat the ceramic process kit. The thin annulus of conducting material 244, which can be disposed on one or more surfaces or within the ceramic process kit, acts as the secondary coil of a transformer and conducts the current induced by RF currents in the source RF coil 260 which generates heat for the process kit. The resistance of the secondary coil is of primary importance because either too low or too high of a resistance results in inefficient power transfer and thus inefficient heating of the process kit.

For the circular geometry indicated in FIG. 12, the resistance R is approximately $2\pi r \rho / w \cdot d$, where r is a measure of the radial dimension of the outer radius of the thin annulus of conducting material, w is the width of the conducting material, d is the thickness of the conducting material, and $\rho$ is the resistivity of the conducting material. The resistance R is preferably controlled by varying w·d, the cross-sectional area of the conducting material 244. To achieve optimal contact with collar 246, it is preferred that w be as large as possible but smaller than the width of the collar 246. One preferred method of obtaining the optimal value of d is empirically monitoring the heating rates of various samples with different thickness d of conducting material. In one preferred embodiment, a process kit having graphite as the conducting material with the annulus having an inner radius of 10 cm and outer radius of 12 cm and thickness of 0.13 mm was heated inductively to a temperature of about 288° C.

In another aspect of the invention, the clean rate or deposition removal rate of the process kit is typically a function of its temperature (i.e., the hotter the shield becomes during processing, the faster it can be cleaned). During cleaning, the conducting material 244 acts as the secondary coil of a transformer which conducts the current induced by RF currents in the source RF coil 260 which generates heat for the process kit. Thus, with increased temperature, the clean rate of collar 246 will be increased, which reduces the downtime of apparatus 2, thereby enhancing the throughput of the process.

Gas Distribution Assembly

Figure 13:
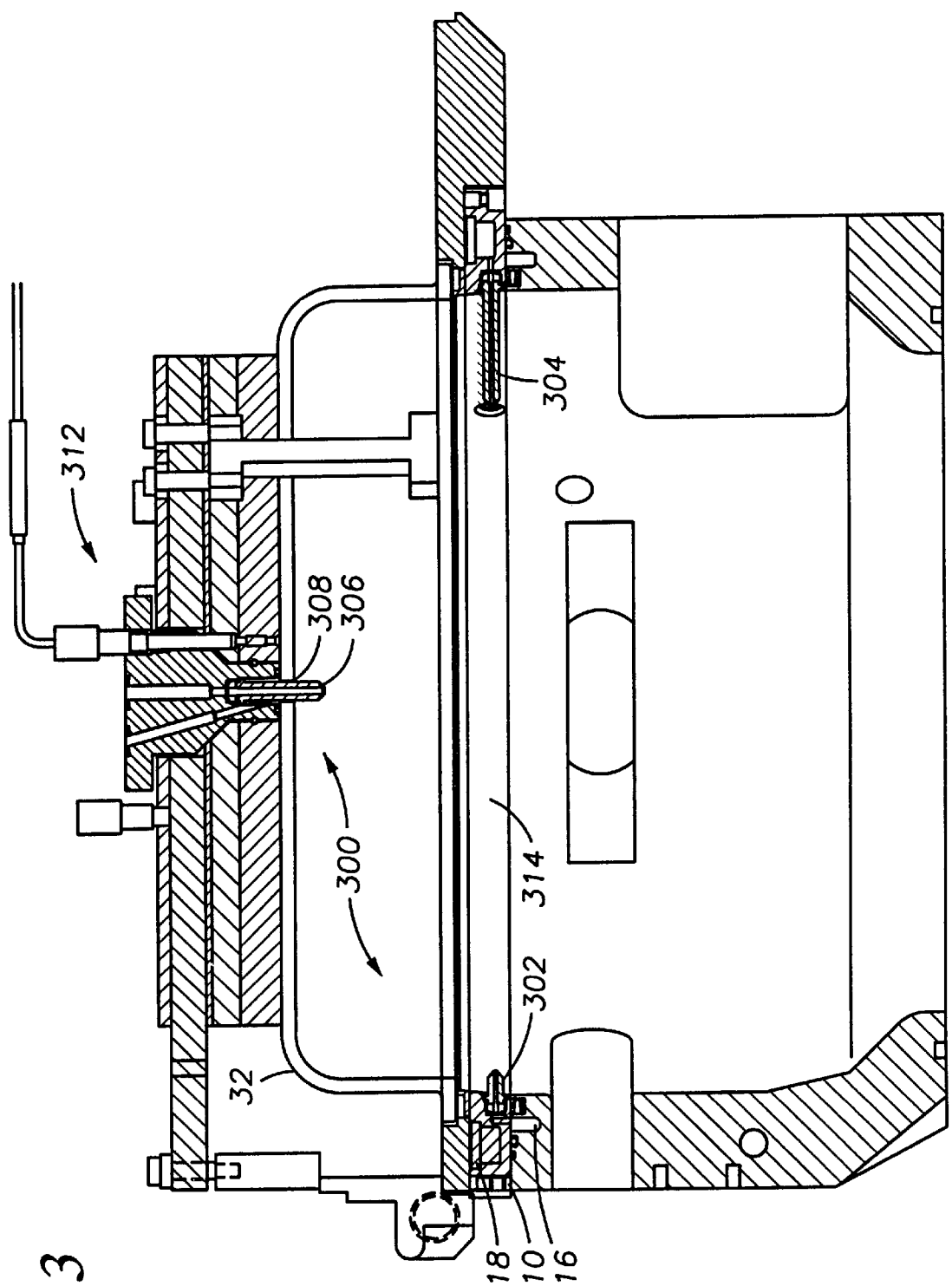
FIG. 13 is a side view partially in section showing the gas control system of the present invention.

The gas distribution assembly 300 will be described below with reference to FIGS. 13–16. FIG. 13 is a cross sectional view through a chamber of the present invention showing the gas distribution assembly 300. Generally, the gas distribution system comprises an annular gas ring 310 disposed between the lower portion of the dome and the upper surface of the chamber body and a centrally located center gas feed 312 positioned through the top of the dome. Gases are introduced into the chamber through both circumferentially mounted gas nozzles 302, 304 located near the bottom of the dome 32, and a centrally located gas nozzle 306 located in the top plate of the dome. One advantage of this configuration is that a plurality of different gases can be introduced into the chamber at select locations within the chamber via the nozzles 302, 304, 306. In addition, another gas, such as oxygen or a combination of gases, can be introduced along side nozzle 306 through a gas passage 308 disposed around nozzle 306 and mixed with the other gases introduced into the chamber.

The gas distribution ring and the centrally located gas manifold will be described separately below.

Generally, the gas distribution ring 310 comprises an annular ring made of aluminum or other suitable material 314 having a plurality of ports formed therein for receiving nozzles therein and which are in communication with one or more gas channels 316, 318. Preferably, there are at least two separate channels formed in the gas ring to supply at least two separate gases into the chamber. Each of the ports for receiving the nozzles is connected to at least one of the gas distribution channels 316, 318 formed in the ring. In one embodiment of the invention, alternating ports are connected to one of the channels, while the other ports are connected to the other channel. This arrangement allows for the introduction of separate gases, such as $SiH_4$ and $O_2$, separately into the chamber, as one example.

Figure 14:
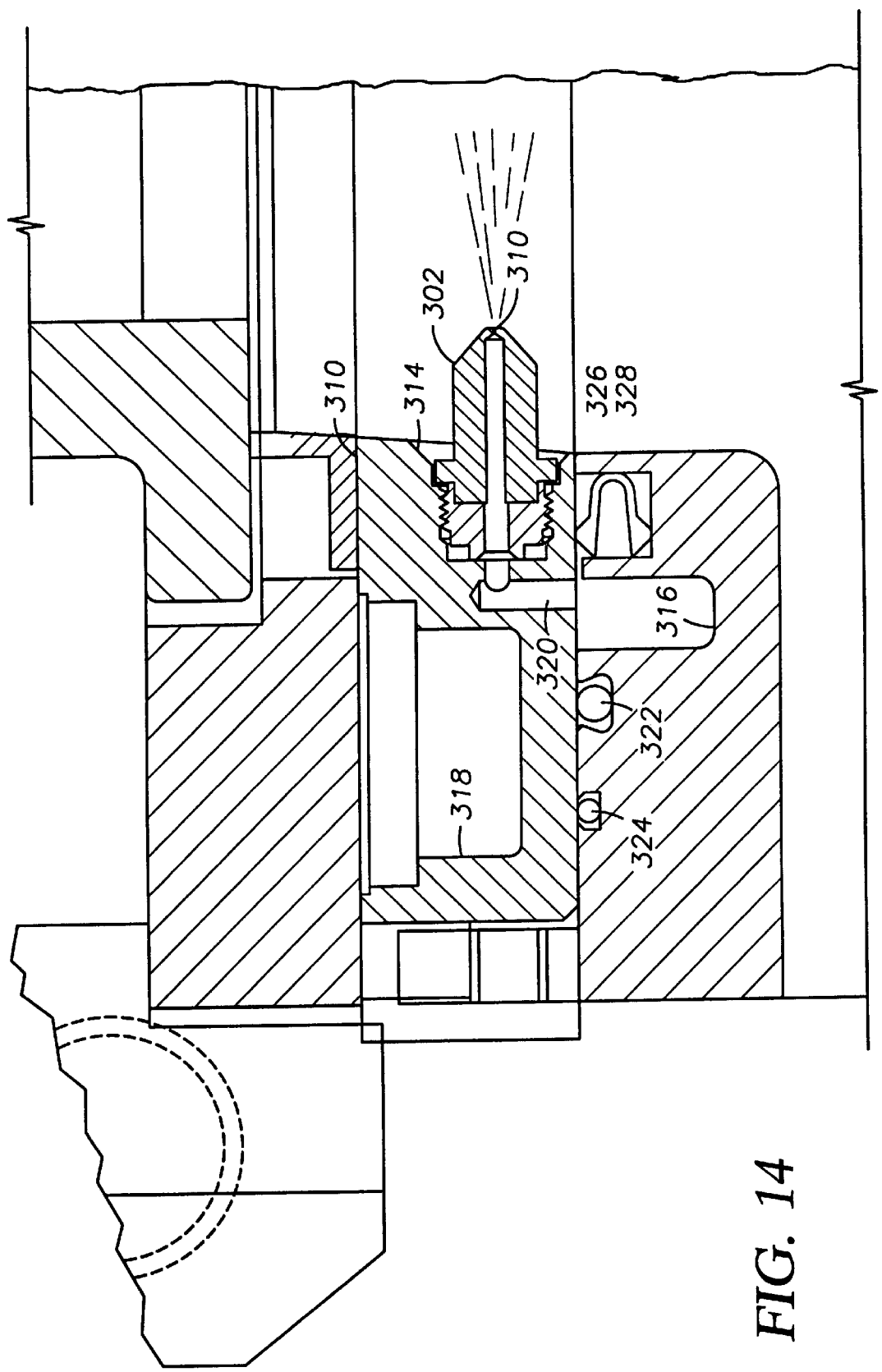
FIG. 14 is a side view partially in section showing the gas distribution ring and first gas channel.

FIG. 14 is a cross sectional view showing a first gas channel 316 connected to one port 314 having a nozzle 302 disposed therein. As shown, the gas channel 316 is formed in the upper surface of the chamber body wall and is preferably annular around the entire circumference of the chamber wall. The annular gas ring has a first set of channels 320 longitudinally disposed within the ring which are connected to each of the ports 314 provided for distribution of the gas in that channel. When the gas ring is positioned over the gas channel, the passages are in communication with the channel. The gas distribution ring is sealed in the top surface of the chamber wall via two separately placed o-rings 322, 324 disposed outwardly from the channel to prevent gas leaks to the interior of the chamber. A Teflon seal 326, or the like, is disposed inwardly of the channel in a recess 328 to prevent gas leakage into the chamber.

The nozzles 302, 304 disposed in the ports 314 are preferably threaded and mate with threads in the port to provide a seal therebetween and to provide quick and easy replacement. A restricting orifice 330 is located in the end of each nozzle and can be selected to provide the desired distribution of the gas within the chamber.

Figure 15:
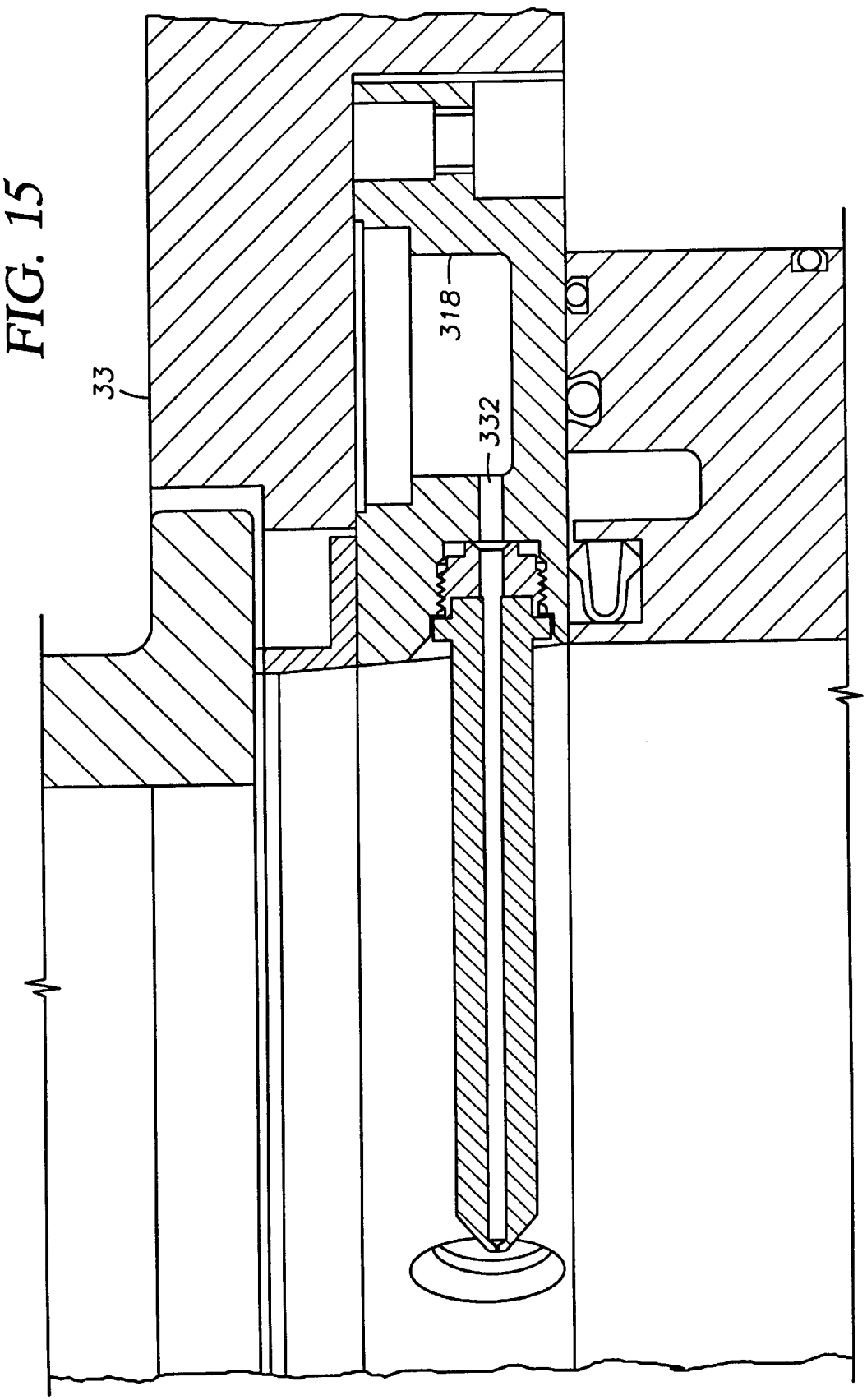
FIG. 15 is a side view partially in section showing the gas distribution ring and the second gas channel.

FIG. 15 is a cross sectional view showing the second gas channel 318. The second gas channel 318 is formed in the upper portion of the annular gas distribution ring and is similarly disposed in an annular configuration around the circumference of the gas distribution ring. A horizontally disposed passage 332 connects the second gas channel to one or more ports formed in the gas ring and in which additional gas nozzles are disposed. The upper containing surface of the second gas channel is formed by the portion of the lid which supports the dome 32 and is sealed at the top by the base plate 33. The gas ring 310 is bolted to the base plate 33 which is hingedly mounted to the chamber body.

One advantage of the present invention is that the gas distribution ring can be easily removed and replaced with a ring having ports formed for receiving and positioning the tips of the nozzles at various angles so that the distribution pattern of gases can be adjusted. In other words, in certain applications it may be beneficial to angle some of the gas nozzles upwardly in the chamber, or conversely to angle some of them downwardly in the chamber. The ports formed in the gas distribution ring can be milled so that a desired angle can be selected to provide the desired process results. In addition, having at least two gas channels which can deliver at least two gases separately into the chamber allows greater control of the reaction which occurs between the various gases. Still further, reaction of the gases within the gas distribution assembly can be prevented by delivering the gases separately into the chamber.

Figure 16:
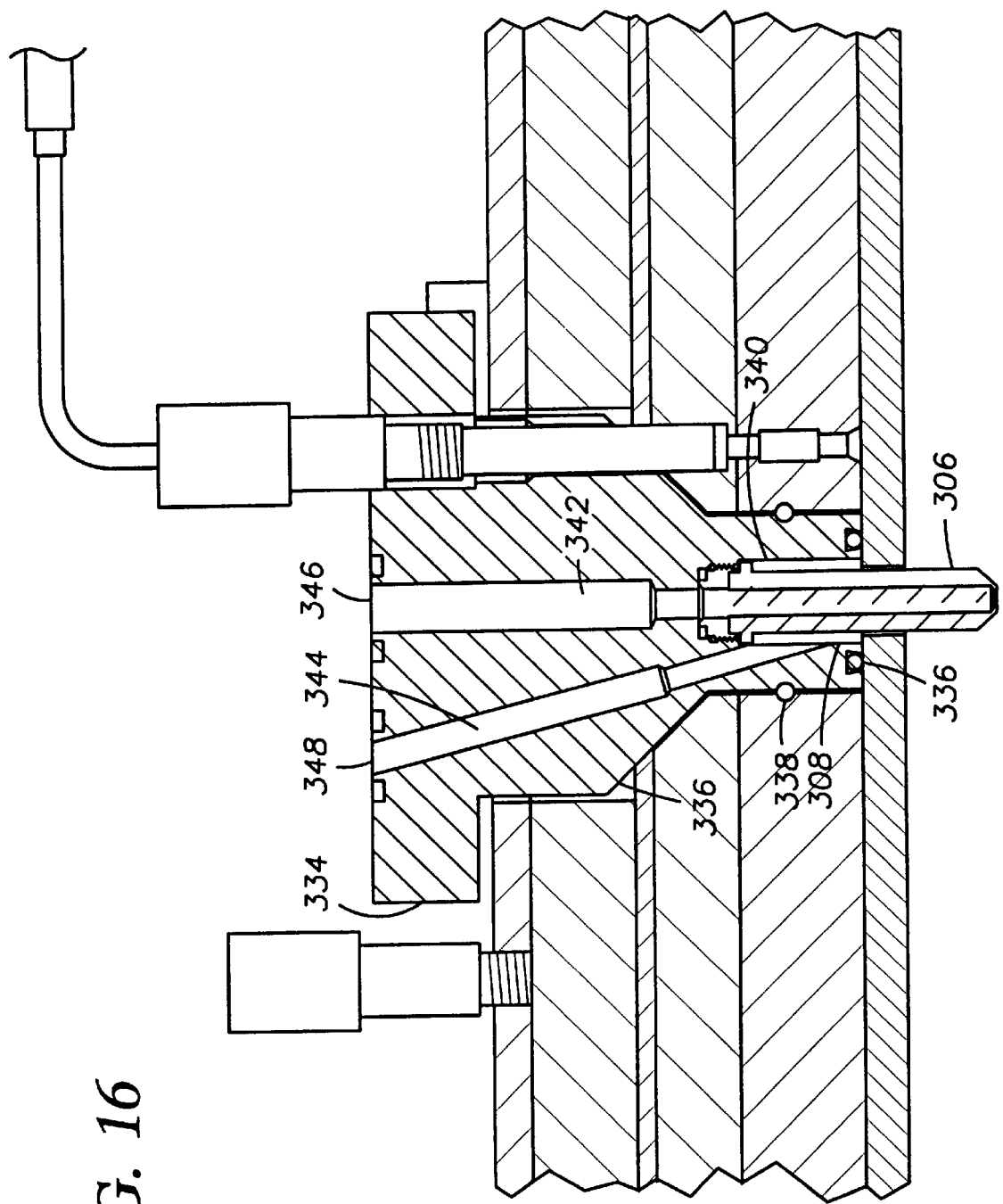
FIG. 16 is a side view partially in section showing the center gas feed assembly.

FIG. 16 is a cross sectional view showing the center gas feed 312 disposed through the dome 32. The top gas feed 312 is preferably a tapered structure having a base 334 which is disposed on the top of the dome and a tapered body 336 disposed in a recess formed in the dome. Two separate o-rings 336, 338, one the lower surface of the taper body 336 and one on the side surface of the taper body 338 towards the lower end, provided sealable contact between the gas feed 312 and the dome of the chamber. A port 340 is formed in the lower portion of the body of the top gas feed to receive a nozzle 306 for delivering gases into the chamber. At least one gas passage 342 is disposed through the gas feed 310 connected to the port to deliver gases to the back of the nozzle. In addition, the nozzle 306 is tapered and the port 340 define a second gas 308 passage which delivers a gas along side of the nozzle 306 and into the chamber. A second gas channel 304 is disposed through the gas feed 312 to deliver gas into the passage 308. A gas, such as oxygen, can be delivered along side a gas such as $SiH_4$.

Figure 17:
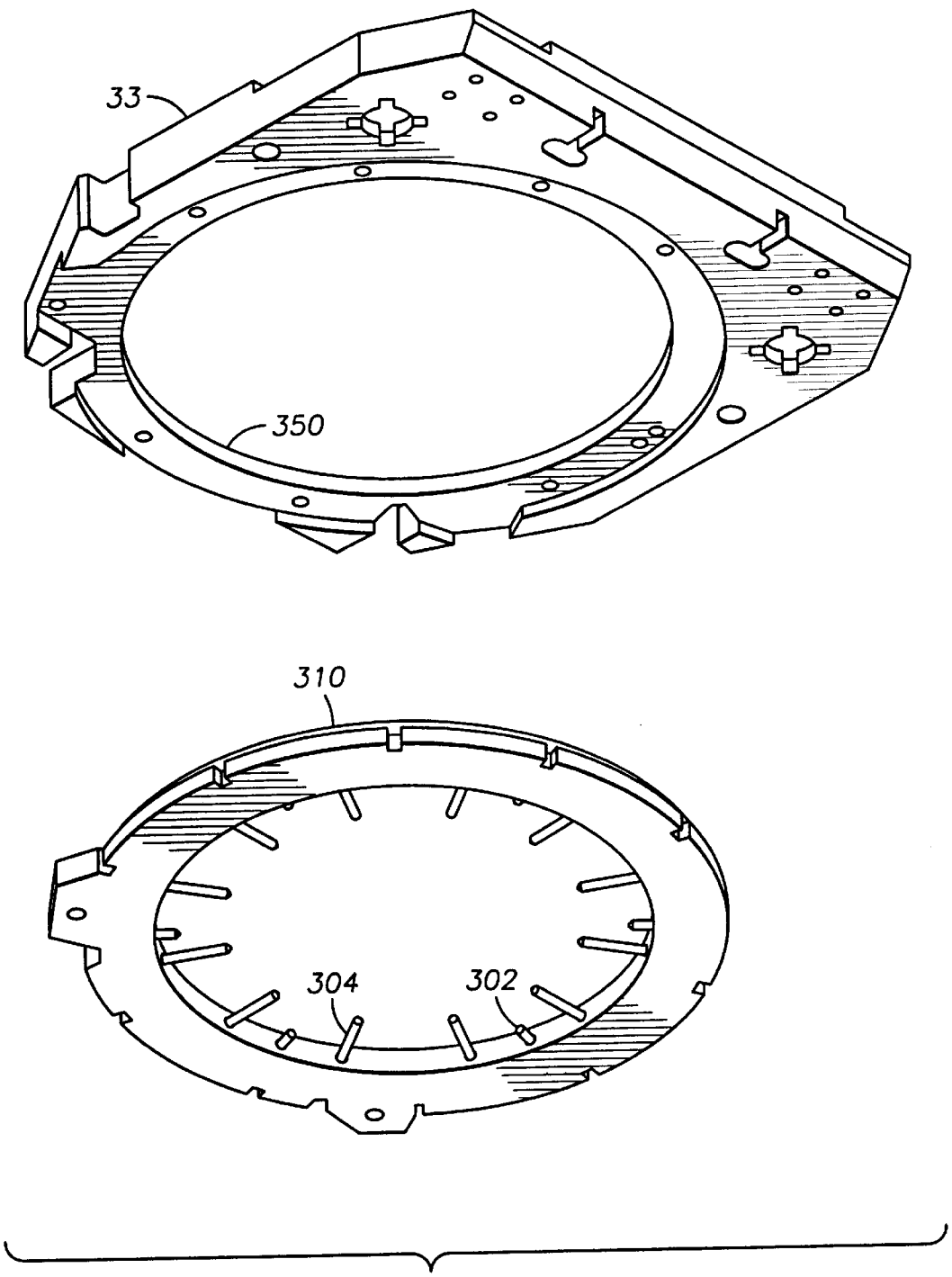
FIG. 17 is an exploded view of the gas distribution ring and the lose plate of the lid assembly.

FIG. 17 is an exploded view showing the base plate 33 of the lid assembly and the gas distribution ring 310. A channel 350 is formed in the lower portion of the base plate 33 to receive the gas distribution ring 310. The gas ring 310 is bolted, or otherwise mounted, to the base plate 33. The base plate is hingedly mounted to the chamber body.

A first gas source 352 and a first gas controller 354 control entry of a first gas via line 356 into a first gas channel 316 formed in the chamber wall. Similarly, a second gas source 358 and a second gas controller 360 supply a second desired gas via line 362 into the second gas channel 318 formed in the gas distribution ring.

A third gas source 364 and a third gas controller 366 supply a third gas via line 368 to a gas channel disposed on the top of the chamber. A fourth gas source 370 and a fourth gas controller 372 supply a fourth gas via line 374 to gas passage 308. The gas introduced through the third gas nozzle and fourth gas nozzle 64 and $O_2$ are mixed in the upper portion of chamber as both gases enter the chamber.

Remote Plasma Cleaning System

The remote plasma source generally includes a remote chamber having a gas inlet and a gas outlet, a power source coupled to the chamber by a waveguide, and an applicator tube disposed through the chamber between the gas inlet and gas outlet. FIG. 18 shows a schematic view of a remote plasma source 500 connected to a chamber. A chamber 502 is a cylindrical chamber, preferably made of aluminum, having a gas inlet 504 and a gas outlet 506 disposed on opposite ends thereof. The chamber is preferably cooled using either a fan disposed through a wall of the chamber or by using a fluid cooling system such as a series of coils having a heat transfer fluid such as water flown therethrough. An applicator tube 508, such as a sapphire tube, or other energy transmissive tube, is disposed between the gas inlet and gas outlet within the chamber 502. A water cooled delivery conduit 510 connects the gas outlet to a gas channel 28 formed in the lower portion of the processing chamber 10. A power source is coupled to the chamber by a waveguide 512. One remote plasma source which can be used to advantage in the present invention is described in U.S. patent application Ser. No. 08/278,605, filed on Jul. 21, 1994, which is incorporated herein by reference.

Preferably, power in the range of from about 2000W to about 5000W is delivered into the chamber 502. The optimum power needed to dissociate the gas should be used. Any additional power is wasted and is typically used in generating additional heat. Lower power than optimum results in an incomplete dissociation of the cleaning gas and a decrease in the clean rate and efficiency. In one embodiment, a single power source is used to drive both the source antenna and the remote plasma chamber.

In the chamber, it is believed that the cleaning reactions which proceed most rapidly are of the type:

$$4F^*_{(Gas)} + SiO_3 \rightarrow SiF_{4(Gas)} + O_{2(Gas)}$$

and $$2F^*_{(Gas)} + SiO_{2(Gas)} \rightarrow SiF_{2(Gas)} + O_{2(Gas)}$$

producing gaseous products which are removed from chamber 13 by vacuum pumping the gas phase. The reactant gases which are most effective at producing high concentrations of long lived excited neutral Fluorine species F* are $NF_3$, $F_2$, $SF_6$, $ClF_3$, $CF_4$, and $C_2F_6$. However, other cleaning gases which are excitable by microwaves and react with deposition material within the chamber may be used. For the remote microwave cleaning system of FIG. 9 in the present invention, it is preferred to use $NF_3$ and $F_2$ diluted to concentrations of from about 10% to about 50% in inert argon gas. The desired cleaning reactions produced by the use of the remote plasma source proceed without any ion bombardment of the chamber or substrate support structures, therefor, the need for cover wafers on the ESC 104, or periodic replacement of critical chamber assemblies is avoided. Thus, a much more efficient use and throughput of the system is provided.

FIG. 18 also shows the cleaning gas delivery channels formed in the chamber walls. Gas is delivered from the remote source 500 to a first gas channel 28 disposed horizontally in the back wall 520 of the chamber. The first gas channel 28 extends the length of the back wall to deliver gases to opposed sides of the chamber. A central gas 522 connection is formed in the lower portion of the chamber and connects to the first gas channel 28 to the delivery conduit 510. A second gas channel 524 is formed in each of the side walls of the chamber and terminate in a slit opening 526 within the chamber. A corner cover is made with a channel formed therein to connect the ends of the first gas channel 28 with each of the side gas channels 524 formed in the sidewalls. The corner cover is preferably welded in position on the chamber body and facilitates gas delivery through the chamber body to the slit openings 526 in the chamber.

A first gas diffusing member 528 is preferably disposed in the slit openings 526 of the second gas channels 524 to guide the cleaning gases into the chamber. FIG. 19 is a top view of the gas diffusing member 528 showing the curved side faces 530, 532 which deliver the cleaning gases to opposite sides of the chamber. The curved surfaces 530, 532 are disposed across the second gas channels 524 to guide the gases outwardly into the chamber.

FIG. 20 is a side view of the gas diffusing member 528. The back portion 534 of the gas diffuser is tapered to allow gases to pass beyond the gas diffuser disposed in the channel 524 so that gas is guided into both sides of the chamber. A recess 536 is formed in one end of the gas diffuser to provide wedged engagement of the diffuser in position within the gas channel. A wedge 538 is provided to mate with the recess and a screw forces the wedge into position within the recess and connects the wedge to the diffuser and connects the diffuser to the chamber body.

In an alternative embodiment, a gas baffler can be disposed in the chamber adjacent to each slit opening 526 in the chamber to direct the cleaning gases upwardly and over the process kit and ESC 104. FIG. 21 shows a perspective view of a baffler 540 which is mounted to the gas diffuser 528 by a flange 542. The body 544 of the baffler provides a curved face 546 which is angled slightly upwardly when positioned in the chamber to urge the cleaning gases upwardly in the chamber and over the ESC 104 and the process kit.

It has been found that the clean process is most efficient when the cleaning gases enter the chamber from above the ESC and process kit. In addition, it is preferred that the gases flow upwardly in the chamber and away from the ESC and process kit to prevent the cleaning gases from pushing particles or residue loosened during the cleaning process onto the ESC. If particles remain on the ESC, the likelihood that helium leaks will occur during chucking increases. The baffle diverts the gas flow upwards to enhance cleaning and prevents deposition of particles on the ESC.

While the foregoing is directed to the preferred embodiment of the present invention, other and further embodiments of the invention may be devised without departing from the basic scope thereof, and the scope thereof is determined by the claims which follow.

What is claimed is:

1. An apparatus for processing substrates, comprising:
   (a) a chamber having:
      (i) a sidewall;
      (ii) a lid disposed at one end of the sidewall; and
      (iii) a bottom disposed at an opposite end of the sidewall;
   (b) a substrate support member cantilever mounted on the sidewall;
   (c) a first process gas inlet disposed through the lid to admit a first process gas into the chamber;
   (d) a second process gas inlet disposed through the sidewall to admit a second process gas into the chamber;
   (e) an exhaust port disposed in the bottom of the chamber;
   (f) an antenna disposed adjacent the lid;
   (g) a variable frequency RF power source connected to the antenna; and
   (h) a control circuit connected to the variable frequency RF power source to continuously adjust an output of the variable frequency RF power source corresponding to chances in power transfer to the antenna.

2. The apparatus of claim 1, wherein the antenna is disposed adjacent a portion of the lid comprised of a material which facilitates transmission of electromagnetic energy therethrough.

3. The apparatus of claim 2, wherein the material is a ceramic.

4. The apparatus of claim 3, wherein the ceramic is selected from the group consisting of $Al_2O_3$, AlN or combinations thereof.

5. The apparatus of claim 1, wherein the antenna comprise one or more coils disposed adjacent the lid.

6. The apparatus of claim 5, wherein the antenna comprise a first and a second coil and the variable frequency RF source comprises a first variable frequency RF source electrically connected to the first coil and a second variable frequency RF source electrically connected to the second coil.

7. The apparatus of claim 6 wherein the first coil is a helical coil wound around a side portion of the lid and the second coil is a flat coil disposed adjacent a top portion of the lid.

8. The apparatus of claim 7 wherein the flat coil disposed on the top portion of the lid defines a passage through which one or more gas inlets are disposed.

9. The apparatus of claim 8 wherein the passage defined by the second coil is centrally located above the substrate support member.

10. The apparatus of claim 6 wherein the first and second variable frequency RF sources are independently controlled by the control circuit.

11. The apparatus of claim 1, wherein the antenna comprise a first and a second coil and the variable frequency RF source is connected to the first and the second coil.

12. The apparatus of claim 11 wherein the variable frequency RF source comprises an RF generator and the apparatus further comprises a power splitter having an input line and a first and a second output line, wherein an output of the RF generator is connected to the input line of the power splitter and the first and second output lines are connected to the first and second coils respectively.

13. The apparatus of claim 12 wherein the power splitter is responsive to a control signal which determines power distribution to the first and second output lines.

14. The apparatus of claim 1 further comprising:
i) a matching network connected between the RF power source and the antenna for matching the RF power source to the antenna.

15. The apparatus of claim 14 wherein matching network comprises an RF matching network selected from the group consisting of: a pi impedance matching network, a balanced antenna impedance matching network, and a grounded antenna matching network.

16. The apparatus of claim 1 wherein the first gas inlet comprises a nozzle having a central gas passage surrounded by an annular gas passage.

17. The apparatus of claim 1 wherein the second gas inlet comprises an annular gas ring having a plurality of nozzles disposed on an interior surface of the annular gas ring.

18. The apparatus of claim 17 wherein the annular gas ring comprises a first set of gas nozzles connected to a first channel disposed in the annular gas ring and a second set of gas nozzles connected to a second channel disposed in the annular gas ring.

* * * * *

UNITED STATES PATENT AND TRADEMARK OFFICE
CERTIFICATE OF CORRECTION

PATENT NO. : 6,083,344
DATED : July 4, 2000
INVENTOR(S) : Hanawa, et. al.

It is certified that error appears in the above-identified patent and that said Letters Patent is hereby corrected as shown below:

In column 20, line 46, please replace "chances" with
-- changes --.

Signed and Sealed this

First Day of May, 2001

Attest:

NICHOLAS P. GODICI

*Attesting Officer*  *Acting Director of the United States Patent and Trademark Office*